United States Patent
Deboy

(10) Patent No.: US 9,911,731 B2
(45) Date of Patent: *Mar. 6, 2018

(54) OPERATIONAL GALLIUM NITRIDE DEVICES

(71) Applicant: Infineon Technologies Austria AG, Villach (AT)

(72) Inventor: Gerald Deboy, Klagenfurt (AT)

(73) Assignee: Infineon Technologies Austria AG, Villach (AT)

(*) Notice: Subject to any disclaimer, the term of this patent is extended or adjusted under 35 U.S.C. 154(b) by 0 days.

This patent is subject to a terminal disclaimer.

(21) Appl. No.: 15/231,495

(22) Filed: Aug. 8, 2016

(65) Prior Publication Data

US 2016/0351559 A1    Dec. 1, 2016

Related U.S. Application Data

(63) Continuation of application No. 14/216,026, filed on Mar. 17, 2014, now Pat. No. 9,472,625.

(51) Int. Cl.
*H01L 33/00* (2010.01)
*H01L 27/06* (2006.01)
(Continued)

(52) U.S. Cl.
CPC ...... *H01L 27/0605* (2013.01); *H01L 27/0629* (2013.01); *H01L 29/2003* (2013.01); *H01L 29/205* (2013.01); *H01L 29/42316* (2013.01); *H01L 29/7786* (2013.01); *H01L 29/7787* (2013.01); *H01L 29/872* (2013.01); *H01L 21/8258* (2013.01); *H01L 29/41766* (2013.01); *H01L 2224/0603* (2013.01); *H02M 1/00* (2013.01); *Y02B 70/1483* (2013.01)

(58) Field of Classification Search
None
See application file for complete search history.

(56) References Cited

U.S. PATENT DOCUMENTS 7,875,907 B2  1/2011  Honea et al.
7,915,645 B2  3/2011  Briere
(Continued)

FOREIGN PATENT DOCUMENTS

CN    101051439 A    10/2007
CN    102027594 A    4/2011
(Continued)

OTHER PUBLICATIONS

Office Action, in the German language, from counterpart German Application No. 102015204766.0, dated Aug. 24, 2016, 10 pp.
(Continued)

*Primary Examiner* — Shaun Campbell
(74) *Attorney, Agent, or Firm* — Shumaker & Sieffert, P.A.

(57) ABSTRACT

A power circuit is described that includes a semiconductor body having a common substrate and a Gallium Nitride (GaN) based substrate. The GaN based substrate includes one or more GaN devices adjacent to a front side of the common substrate. The common substrate is electrically coupled to a node of the power circuit. The node of the power circuit is at a particular potential that is equal to, or more negative than, a potential at one or more load terminals of the one or more GaN devices.

20 Claims, 19 Drawing Sheets

(51) Int. Cl.

| | | |
|---|---|---|
| *H01L 29/20* | (2006.01) | |
| *H01L 29/205* | (2006.01) | |
| *H01L 29/423* | (2006.01) | |
| *H01L 29/778* | (2006.01) | |
| *H01L 29/872* | (2006.01) | |
| *H01L 29/417* | (2006.01) | |
| *H02M 1/00* | (2006.01) | |
| *H01L 21/8258* | (2006.01) | |

(56) References Cited

U.S. PATENT DOCUMENTS

| | | | |
|---|---|---|---|
| 8,530,938 B2 | 9/2013 | Briere | |
| 8,604,512 B2 | 12/2013 | Morita | |
| 9,472,625 B2* | 10/2016 | Deboy | H01L 29/2003 |
| 9,569,996 B2 | 2/2017 | Kimura | |
| 9,673,732 B2 | 6/2017 | Deboy et al. | |
| 2007/0171713 A1 | 7/2007 | Hunter et al. | |
| 2008/0013351 A1* | 1/2008 | Alexander | H02M 3/1582 363/123 |
| 2008/0143421 A1 | 6/2008 | Yanagihara et al. | |
| 2010/0019279 A1 | 1/2010 | Chen et al. | |
| 2010/0187605 A1 | 7/2010 | Haeberlen et al. | |
| 2011/0210337 A1 | 9/2011 | Briere | |
| 2012/0217542 A1* | 8/2012 | Morita | H01L 27/0605 257/140 |
| 2013/0074907 A1 | 3/2013 | Saunders | |
| 2013/0232462 A1 | 9/2013 | Ueno et al. | |
| 2014/0070627 A1 | 3/2014 | Briere et al. | |
| 2014/0346522 A1 | 11/2014 | Disney et al. | |
| 2016/0079233 A1 | 3/2016 | Deboy et al. | |

FOREIGN PATENT DOCUMENTS

| | | |
|---|---|---|
| CN | 102612753 A | 7/2012 |
| CN | 103219910 A | 7/2013 |
| WO | 2010030400 A1 | 3/2010 |

OTHER PUBLICATIONS

Hasan, T. et al., "Effect of sputtered SiN passivation on current collapse of AlGaN/GaN HEMTs," CS Mantech Conference, May 13-16, 2013, pp. 131-134.

Lanford, W. et al., "AlGaN/InGaN HEMTs for RF current collapse suppression," IEE Electronic Letters, Jun. 10, 2004, vol. 40, No. 12, 2 pp.

Yu, C-h. et al., "Donor-Like Surface Traps on Two-Dimensional Electron Gas and Currrent Collapse of AlGaN/GaN HEMTs," The Scientific World Journal, vol. 2013, Article ID 931980, Accepted Aug. 12, 2013, 7 pp.

Mittereder, J.A. et al., "Current collapse induced in AlGaN/GaN high-electron-mobility transistors by bias stress," Applied Physics Letters, vol. 83, No. 8, Aug. 25, 2003, 4 pp.

Koudymov, A. et al., "Mechanism of Current Collapse Removal in Field-Plated Nitride HFETs," IEEE Electron Device Letters, vol. 26, No. 10, Oct. 2005, 4 pp.

Gao, F. et al., "Impact of Moisture and Fluorocarbon Passivation on the Current Collapse of AlGaN/GaN HEMTs," Abstract Only, IEEE Electron Device Letters, vol. 33, Issue 10, Oct. 2012, pp. 1378-1380.

Morita, T. et al., "650V 3.1mΩcm$^2$ GaN-based Monolithic Bidirectional Switch Using Normally-off Gate Injection Transistor," IEEE International, 2007 Electron Devices Meeting (IEDM), Dec. 10-12, 2007, pp. 865-868.

U.S. Appl. No. 14/486,260, filed Sep. 15, 2014.

Office Action, in the Chinese language, from counterpart Chinese Application No. 201510112595.4, dated Jun. 7, 2017, 11 pp.

* cited by examiner

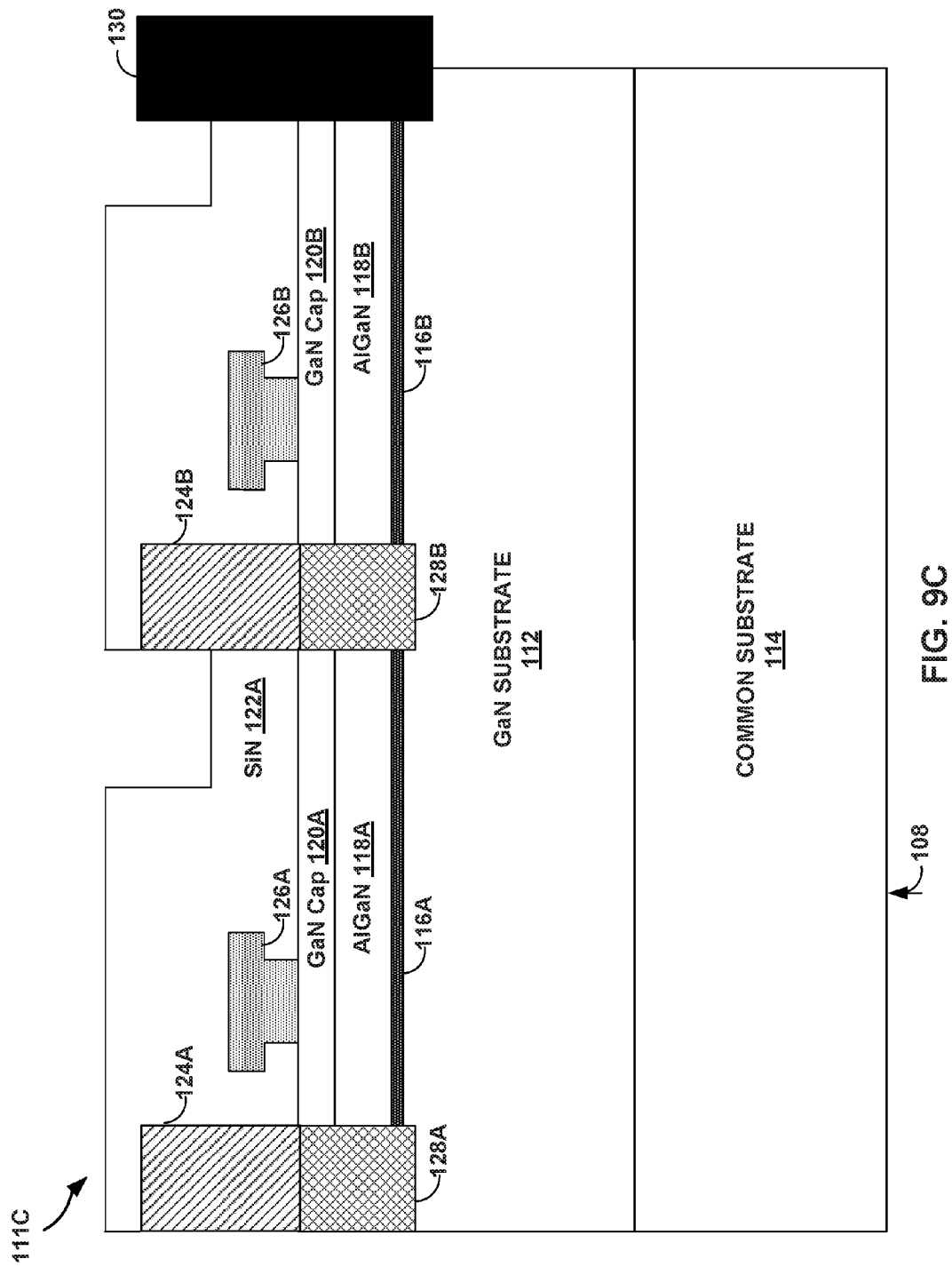

OPERATIONAL GALLIUM NITRIDE DEVICES

This application is a continuation of U.S. application Ser. No. 14/216,026, filed Mar. 17, 2014, the entire content of which is hereby incorporated by reference.

TECHNICAL FIELD

This disclosure relates to techniques and circuits related to semiconductor devices.

BACKGROUND

Gallium Nitride (GaN) may be used as a fabrication material for semiconductor devices. One of the primary advantages of GaN is that GaN has a strain induced piezoelectric charge that allows conduction channels (e.g., two-dimensional electron gas (2DEG) region) to be formed within the GaN based semiconductor device without the need for doping the GaN. Eliminating the need for doping the GaN, may reduce the impurity scattering effect of the semiconductor device which may allow intrinsic carrier mobilities to form in a current conducting channel (e.g., 2DEG region) that has a low on-resistance ($R_{DSON}$).

However GaN may contain traps that, due to a potentially large band gap associated with GaN, may trap or pull and retain mobile carriers within the GaN. These traps may lead to an adverse effect associated with GaN based semiconductor devices known as current collapse which causes a decrease in a quantity of mobile carriers in the current conducting channel. A semiconductor device may rely on a combination of a GaN substrate and a common substrate (e.g., a Silicon (Si) substrate, a Silicon-Carbide (SiC) substrate, or other similar type of substrate made from a material that exhibits similar electrical and chemical properties as Si or SiC) to improve performance of the semiconductor device over other types of semiconductor devices without increasing cost. However, semiconductor devices that rely on a combination of a GaN substrate and a common substrate may suffer from an abnormally high rate of traps. Having a high rate of traps may render the GaN based semiconductor device to be ineffective and unusable as a High Electron Mobility Effect Transistors (HEMT). For example, current collapse in a GaN based semiconductor device can increase $R_{DSON}$ of the GaN based semiconductor device by a factor of 100, and in effect, render the GaN semiconductor device useless for most HEMT applications.

SUMMARY

In general, techniques and circuits are described for configuring a semiconductor device to have one or more GaN devices without suffering the effects of current collapse. For example, a power circuit as described herein may be configured to reduce or eliminate current collapse of one or more GaN devices by applying a low potential to a common substrate. In some examples, the low potential may be directly applied by the power circuit to the GaN device, and the low potential to be applied to the substrate may be directly taken from the power circuit. In other examples, the low potential may be applied by the power circuit via diodes and/or switches.

A system may include a controller unit coupled to a power circuit with input terminals for receiving power from a power source. According to the techniques described herein, the controller unit may determine a low potential of the system, and deliver commands and/or signals to the power circuit with at least one controller, to control the diodes and/or switches on and/or off to apply a low potential to the common substrate.

In one example, a power circuit that comprises a semiconductor body, the semiconductor body comprising a common substrate, and a Gallium Nitride (GaN) based substrate including one or more GaN devices adjacent to a front side of the common substrate, wherein the common substrate is electrically coupled to a node of the power circuit, the node being at a particular potential that is equal to or more negative than a potential at one or more load terminals of the one or more GaN devices.

In another example, a semiconductor device that comprises a common substrate electrically coupled to a node of a power circuit, and one or more Gallium Nitride (GaN) devices, the one or more GaN devices comprising a GaN substrate adjacent to a front side of the common substrate, a two-dimensional electron gas (2DEG) region adjacent to the GaN substrate and opposite the front side of the common substrate, an Aluminum Gallium Nitride (AlGaN) layer adjacent to the 2DEG region and opposite the GaN substrate, and one or more load terminals, wherein the 2DEG region comprises electrons being repelled away from the GaN substrate toward the AlGaN layer based at least in part on a particular potential at the node of the power circuit electrically coupled to the common substrate, and wherein the particular potential is equal to or more negative than a potential at the one or more load terminals.

In another example, a method that comprises determining a particular potential at a node of a power circuit that is equal to or more negative than a terminal potential at one or more load terminals of one or more Gallium Nitride (GaN) devices, wherein each of the one or more GaN devices is included on one or more GaN substrates of a semiconductor body, the one or more GaN substrates being adjacent to a front side of a common substrate of the semiconductor body, and applying the particular potential at the node of the power circuit to the common substrate of the semiconductor body, wherein applying the particular potential reduces an amount of current collapse in the semiconductor body.

The details of one or more examples are set forth in the accompanying drawings and the description below. Other features, objects, and advantages of the disclosure will be apparent from the description and drawings, and from the claims.

BRIEF DESCRIPTION OF DRAWINGS

FIGS. 9A-9C are cross sectional layered views each illustrating an example of a switch-based semiconductor body of the example semiconductor body shown in FIG. 2.

DETAILED DESCRIPTION

Figure 1:
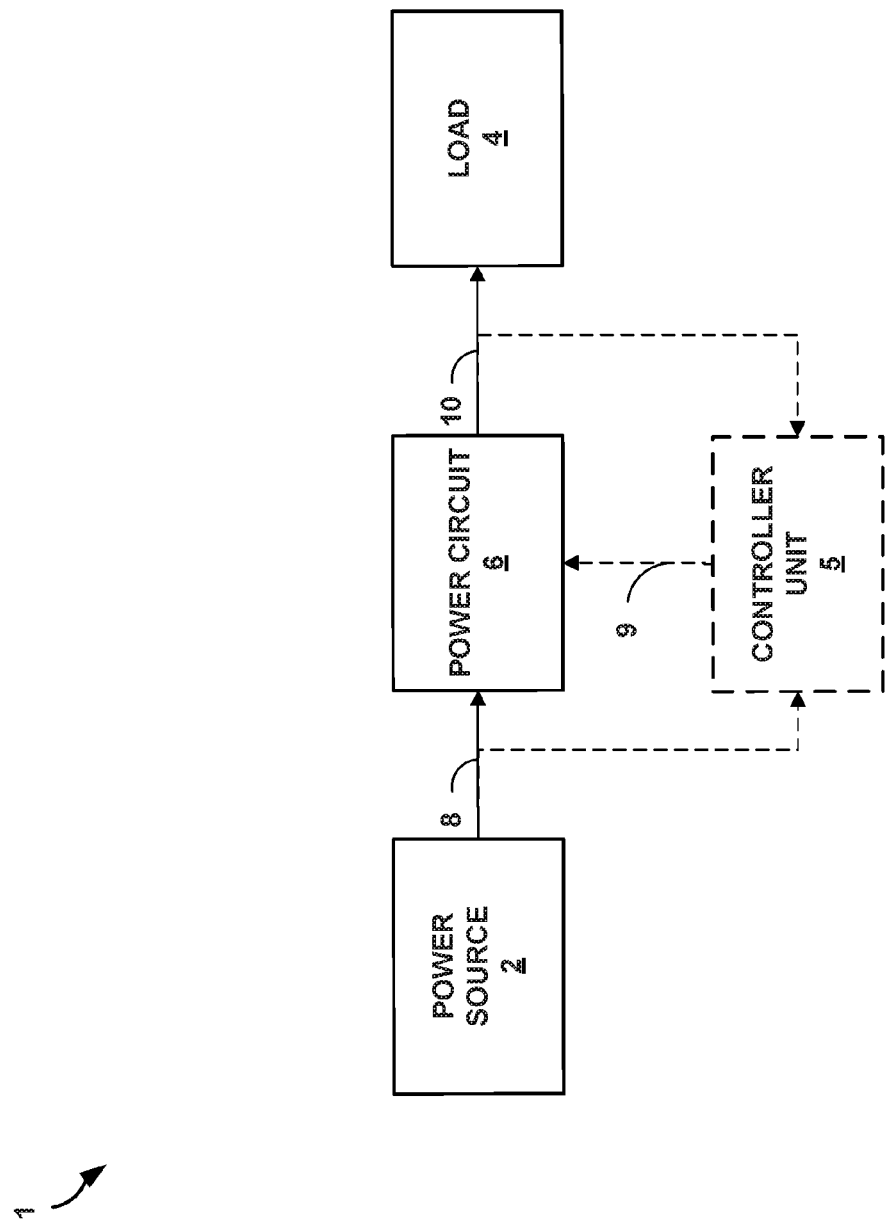
FIG. 1 is a block diagram illustrating an example system for powering a load, in accordance with one or more aspects of the present disclosure.

Some electrical devices (e.g., transistors, diodes, switches, and the like) are semiconductor based, or in other words, made from semiconductor materials such as Silicon (Si), Silicon-Carbide (SiC), Gallium Nitride (GaN), and the like. For example, a bidirectional GaN switch may include one or more GaN devices (e.g., two GaN switches) with an AlGaN layer and adhered to a substrate and/or substrate combination, such as a combination of GaN substrate and Si substrate. In some examples, using more than one Si substrate layer or the like may reduce the lattice mismatch between the GaN substrate and the Si substrate.

Some benefits to using GaN based components, such as GaN high-electron-mobility transistors (HEMTs) are that GaN based components are considered to have a higher degree of performance at a lower cost than other types of HEMTs or similar type semiconductor components. For example, unlike other types of semiconductor components, GaN based components may have high saturation velocities (e.g., $2.5 \times 10^7$ cm/s for GaN compared to Si, $1 \times 10^7$ cm/s) and breakdown field strength (e.g., $5 \times 10^6$ V/cm for GaN compared to Si, ~$3 \times 10^5$ V/cm). GaN based components may also have direct and large bandgaps (e.g., 3.4 eV for GaN compared to silicon 1.1 eV) allowing for lower specific on resistance ("RDsON") and a high operational temperature.

One of the primary advantages of GaN is that GaN has a strain induced piezo-electric charge that allows conduction channels (e.g., two-dimensional electron gas (2DEG) region) to be formed within the GaN based semiconductor device without the need for doping the GaN. Eliminating the need for doping the GaN, may reduce the impurity scattering effect of the semiconductor device which may allow intrinsic carrier mobilities to form in a current conducting channel (e.g., 2DEG region) that has a low on-resistance ($R_{DSON}$).

However GaN may contain traps that, due to a potentially large band gaps associated with GaN, may trap or pull and retain mobile carriers within the GaN. These traps may lead to an adverse effect associated with GaN based semiconductor devices known as current collapse which causes a decrease in a quantity of mobile carriers in the current conducting channel. A semiconductor device may rely on a combination of a GaN substrate and a common substrate (e.g., a Silicon (Si) substrate, a Silicon—Carbide (SiC) substrate, or other similar type of substrate made from a material that exhibits similar electrical and chemical properties as Si or SiC) to improve performance of the semiconductor device over other types of semiconductor devices without increasing cost. However, semiconductor devices that rely on a combination of a GaN substrate and a common substrate may suffer from an abnormally high rate of traps. Having a high rate of traps may render the GaN based semiconductor device to be ineffective and unusable as a High Electron Mobility Effect Transistors (HEMT). For example, current collapse in a GaN based semiconductor device can increase $R_{DSON}$ of the GaN based semiconductor device by a factor of 100, and in effect, render the GaN semiconductor device useless for most HEMT applications.

The ineffectiveness of a GaN based semiconductor device as an type of HEMT may also prevents the use of a lateral GaN device structure, which may be combined with a very high-ohmic substrate, such as Si substrate layers, to allow the integration of more than one switch. Therefore, current collapse may prevent the integration of one or more bidirectional GaN switches on a common substrate.

One technique for reducing current collapse involves the passivation of the top surface of the AlGaN/GaN device. For example, current collapse may be reduced by increasing the SiN deposition and post annealing temperatures on the surface of the AlGaN/GaN device. Other combinations of depositions, such as hydrophobic passivation to prevent DC-to-RF dispersion, may be used in the passivation of the surface of the AlGaN/GaN device to reduce current collapse. However, the passivation of the top surface of the device does not reduce interface traps at the AlGaN layer or the GaN substrate (i.e., GaN buffer).

Another technique for reducing current collapse includes the addition of Indium Gallium (InGaN) to the conducting channel between the AlGaN layer and the GaN substrate. Adding InGaN to the conducting channel may improve the electron transport properties, by suppressing current collapse that is related to the surface states. However, adding InGan involves adding additional material between the AlGaN layer and the GaN substrate which may increase cost.

Another technique for reducing current collapse in AlGaN/GaN HEMTs is to adopt backside doping (i.e., phosphorus) in the bottom of the GaN substrate. By doping the backside of the GaN substrate with phosphorus, the energy band structure can be regulated and more electrons can be accumulated in the channel rather than in other areas of the semiconductor device.

In general, circuits and techniques of this disclosure may enable a semiconductor device (e.g., "semiconductor body") to have one or more GaN devices and a "common" substrate by eliminating, or at least reducing, current collapse. The ability of the semiconductor device to have one or more GaN devices and a common substrate is achieved, at least in part, through careful selection of the polarity of the common substrate. A positive potential on the common substrate relative to the source potential of the GaN HEMT, may attract electrons from the 2DEG region towards the backside of the GaN HEMT. Below the 2DEG region, the traps that are present in the GaN substrate (predominantly carbon) will capture these escaped electrons. As carbon traps are located within the band gap of the GaN substrate, the GaN substrate will effectively capture the escaped electrons while at room temperature operation.

In some examples, the polarity of a GaN device may frequently change, as described in FIG. 3 below. For example, none of the power terminals of a GaN device that acts as a bidirectional switch may generally provide a low potential throughout the operation of the GaN device when the GaN device is configured as a bidirectional switch. Instead, in some examples, the only low potential continuously available to such a GaN device may be at an input terminal or at an output terminal of the power circuit in which the GaN device is being used.

In some examples, a semiconductor body of a power circuit may be integrated with one or more additional switches of the power circuit. The one or more additional switches may cause a low potential (e.g., potential V−) at a node of the power circuit to be applied to the backside of the common substrate of the semiconductor body throughout the operation of the semiconductor body. In other words, the one or more additional switches may electrically couple potential V− at a node of the power circuit available to the semiconductor body, to the backside of the common substrate of the semiconductor body structure in order to push the electrons from the 2DEG region of the GaN device towards the interface between the GaN layer and the AlGaN layer. By pushing the electrons towards the interface, the electrons may be prevented from escaping the 2DEG region due to the barrier at the heterojunction of the AlGaN layer and the GaN substrate. This barrier is a physical barrier to the electrons towards the AlGaN layer on top of the 2DEG, which comes from the nature of the heterojunction. However, towards the GaN substrate there is no barrier, but only a biasing, which is visible as curvature of the valence and conduction band. The circuits and techniques of this disclosure may provide a semiconductor device (e.g., a GaN HEMT) that, as a result of having a common substrate that remains coupled to a low potential, is less susceptible to current collapse. A particular potential applied to the common substrate should be either more negative or at most equal to the lowest potential occurring at the load terminals at any time during the operation of the circuit. In some examples, the load terminals may be one of a source terminal, a drain terminal, a cathode electrode, or an anode electrode. In yet other examples, by applying the particular potential equal to or more negative than the load terminals, the semiconductor will have the right biasing of the conduction bands, keeping the electrons within the 2DEG region. In this way the techniques and circuits may provide a semiconductor device having one or more GaN devices (e.g., bidirectional switches and the like) and a single common substrate that can operate in a power circuit without suffering from current collapse, and as a result, may lower manufacturing costs, reduce physical size, and increases efficiency of the semiconductor devices over other types of semiconductor devices.

FIG. 1 is a block diagram illustrating example system 1 for powering load 4, in accordance with one or more aspects of the present disclosure. In the example of FIG. 1, system 1 has multiple separate and distinct components shown as power source 2, power circuit 6, load 4, and controller unit 5, however system 1 may include additional or fewer components. For instance, power source 2, power circuit 6, load 4, and controller unit 5 may be four individual components or may represent a combination of one or more components that provide the functionality of system 1 as described herein.

System 1 includes power source 2 which provides electrical energy in the form of power to system 1. Numerous examples of power source 2 exist and may include, but are not limited to, power grids, generators, power transformers, batteries, solar panels, windmills, degenerative braking systems, hydro electrical generators, or any other form of electrical power devices capable of providing electrical power to system 1.

System 1 includes power circuit 6 which operates as an intermediary device for controlling the flow of electrical energy provided by power source 2 as is used to power load 4. For example, power circuit 6 may be a single switch or may be a plurality of switches for turning on and/or turning off the flow of electrical energy from source 2 to load 4. In some examples, the switches may be bidirectional (e.g., "bilateral") switches and/or diodes.

In some examples, power circuit 6 may be a switch-based power converter that converts electrical energy provided by power source 2 into a usable form of electrical power for load 4. For example, power circuit 6 may be an AC-to-DC converter that outputs power with a rectified DC voltage from an AC voltage received at an input of the AC-to-DC converter. One example of such as AC-to-DC converter may be referred to as a rectifier. In some examples, the rectifier may have a half-bridge configuration or a full-bridge configuration. In other examples, the rectifier may include switches, such as bidirectional switches, and diodes. Power circuit 6 may instead comprise a DC-to-AC converter configured to output power with an AC voltage from a DC voltage received at an input of the DC-to-AC converter. One example of such a DC-to-AC converter may be referred to as an inverter. In some examples, the inverter may use four switches, such as bidirectional switches in a H-bridge configuration to convert the DC voltage to an AC voltage. In still other examples, power circuit 6 may be a DC-to-DC converter that is capable of outputting power with a DC voltage that is higher or lower than an input DC voltage. Examples of power circuit 6 may include battery chargers, microprocessor power supplies, and the like. System 1 includes load 4 which receives the electrical power (e.g., voltage, current, etc.) converted by power circuit 6 and in some examples, uses the electrical power to perform a function. Numerous examples of load 4 exist and may include, but are not limited to, computing devices and related components, such as microprocessors, electrical components, circuits, laptop computers, desktop computers, tablet computers, mobile phones, batteries, speakers, lighting units, automotive/marine/aerospace/train related components, motors, transformers, or any other type of electrical device and/or circuitry that receives a voltage or a current from a power converter.

Controller unit 5 of system 1 is coupled to the input of power circuit 6 at link 8, the output of power circuit 6 at link 10. Controller unit 5 is further coupled to power circuit 6 via link 9 to send signals or commands to control power circuit 6 for controlling various operations of power circuit 6.

Controller unit 5 is optional and may comprise any suitable arrangement of hardware, software, firmware, or any combination thereof, to perform the techniques attributed to controller unit 5 herein, such as, but not limited to, implementing determining a low potential of power circuit 6 and/or applying a low potential of power circuit 6 to a common substrate of power circuit 6. For example, controller unit 5 may include any one or more microprocessors, digital signal processors (DSPs), application specific integrated circuits (ASICs), field programmable gate arrays (FPGAs), or any other equivalent integrated or discrete logic circuitry, as well as any combinations of such components.

When controller unit 5 includes software or firmware, controller unit 5 further includes any necessary hardware for storing and executing the software or firmware, such as one or more processors or processing units. In general, a processing unit may include one or more microprocessors, DSPs, ASICs, FPGAs, or any other equivalent integrated or discrete logic circuitry, as well as any combinations of such components.

As described in detail below, controller unit 5 may determine a low potential of power circuit 6 and configure power circuit 6 such that the low potential of power circuit 6 is applied to a common substrate of a semiconductor device of power circuit 6. For example, controller unit 5 may receive information via link 8 and/or 10 that indicates a low potential of power circuit 6. Based on the information received via link 8 and/or 10, controller unit 5 may provide a command or signal via link 9 to power circuit 6 that causes the low potential of power circuit 6 to be applied to a common substrate of a semiconductor device of power circuit 6.

Power source 2 may provide electrical power with a first voltage or current level over link 8 and load 4 may receive electrical power, converted by power circuit 6 to have a second voltage or current level, over link 10. Links 8 and 10 represent any medium capable of conducting electrical power from one location to another. Examples of links 8 and 10 include, but are not limited to, physical and/or wireless electrical transmission mediums such as electrical wires, electrical traces, conductive gas tubes, twisted wire pairs, and the like. Link 10 provides electrical coupling between power circuit 6 and load 4 and link 8 provides electrical coupling between power source 2 and power circuit 6. Load 4 is electrically coupled to power circuit 6 which is electrically coupled to power source 2.

In the example of system 1, the voltage or current level of the electrical power delivered by power source 2 can be converted by power circuit 6 to an AC or DC voltage or current level used by load 4. For instance, power source 2 may output, and power circuit 6 may receive, power that has a first AC or DC voltage or current level at link 8. In some examples, controller unit 5 may issue commands over link 9 that cause power circuit 6 to convert the first AC or DC voltage or current to a second AC or DC voltage or current that is required by load 4. Power circuit 6 may output, and load 4 may receive the power converted by power circuit 6 at link 10. Load 4 may use the power received from power circuit 6 to perform a function (e.g., power a microprocessor).

Figure 2:
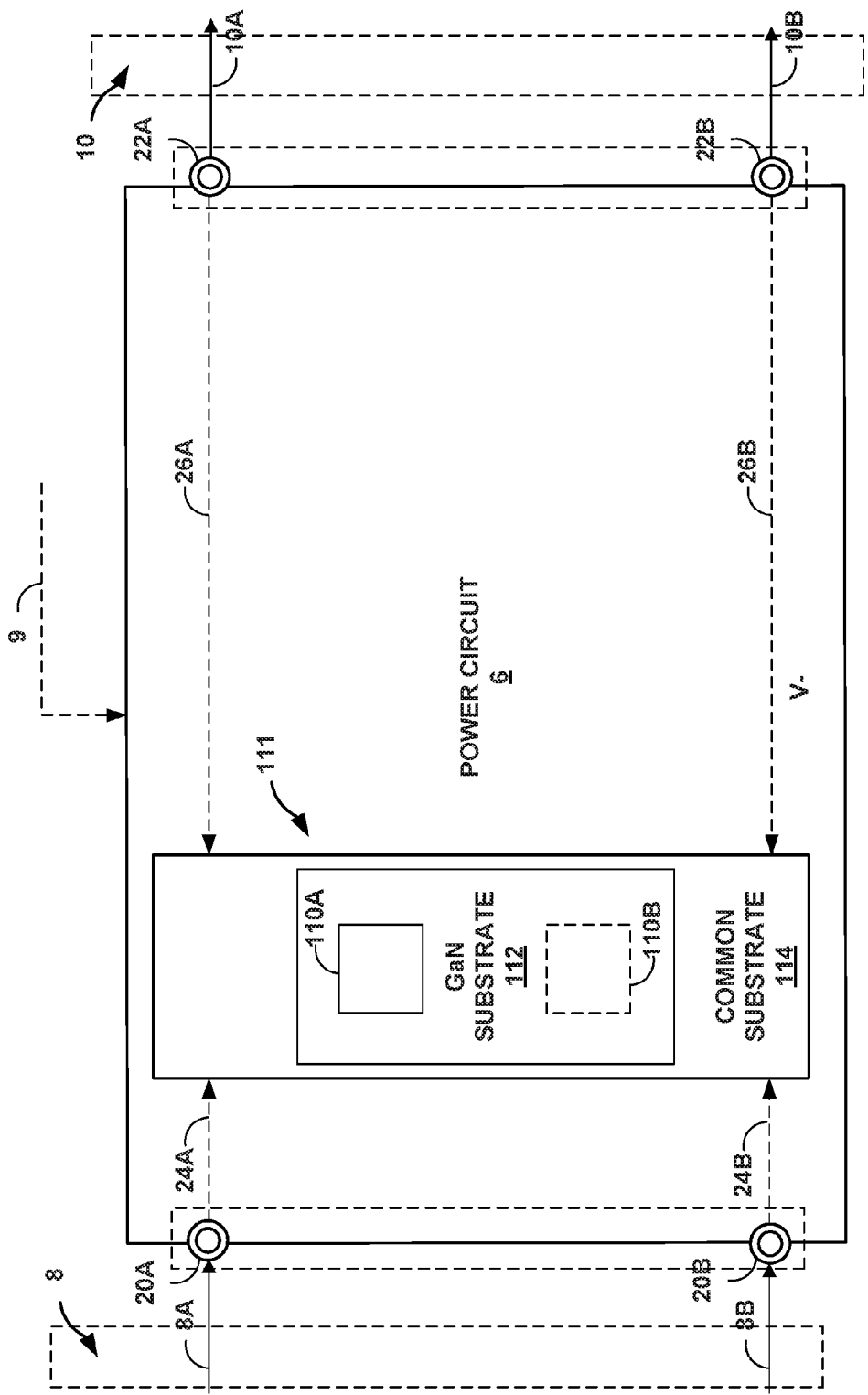
FIG. 2 is a block diagram illustrating one example of a power circuit of the example system shown in FIG. 1, in accordance with one or more aspects of the present disclosure.

FIG. 2 is a block diagram illustrating one example of power circuit 6 of example system 1 shown in FIG. 1, in accordance with one or more aspects of the present disclosure. FIG. 2 is described within the context of system 1 of FIG. 1.

In the example of FIG. 2, power circuit 6 includes two input terminals 20A and 20B (collectively referred to as "input terminals 20"), two output terminals 22A and 22B (collectively referred to as "output terminals 22"), and semiconductor body 111.

Semiconductor body 111 is shown having GaN device 110A and an optional GaN device 110B (collectively referred to as "GaN devices 110") on GaN substrate 112 and common substrate 114. In the example of FIG. 2, semiconductor body 111 of power circuit 6 is optionally connected to input terminals 20 and output terminals 22 by, respectively, input links 24A and 24B (collectively referred to as "links 24") and output links 26A and 26B (collectively referred to as "links 26"). At least one of input terminals 20 and/or output terminals 22 provide a low potential ("V−") to common substrate 114 via at least one of links 24 and 26. FIG. 2 further illustrates link 9 coupled to power circuit 6, for receiving, for example, signals or commands from controller unit 5 for controlling various functions and operations of power circuit 6.

Input terminals 20 receive power from power source 2 to power circuit 6 as shown by links 8A and 8B of link 8, and as described in FIG. 1. Output terminals 22 output power from power circuit 6 to load 4 as shown by links 10A and 10B of link 10, and as described in FIG. 1.

Potential V− may be any particular potential at a node in power circuit 6 that maintains the electrons within the 2DEG region due to the bending of the conduction band. In some examples, potential V− may be received from or provided by at least one of input terminals 20 or output terminals 22. As used herein, a node of a power circuit represents any point of the power circuit from which an electrical connection to a substrate of a semiconductor body can be made. For example, input terminals 20 and output terminals 22 each represent example "nodes" of power circuit 6. In addition, links 24 and 26 may represent nodes of power circuit 6. Other terminals of other devices and semiconductor bodies of power circuit 6 may represent additional nodes. In some examples, a node may comprise a load terminal of a switch (e.g., a source or a drain terminal of a GaN switch, a cathode or anode terminal of a GaN diode, etc.).

In other examples, potential V− may be directly applied to common substrate 114, causing electrons to be repelled away from a GaN substrate towards an AlGaN layer reducing and/or eliminating current collapse of a GaN device, as described in more detail below in FIG. 9A. In yet other examples, potential V− may be the lowest potential available to power circuit 6. In some examples, potential V− may not be the lowest potential available to power circuit 6, but rather, may be a potential that is strong enough to repel electrons toward the AlGaN layer away from the GaN substrate. In some examples, is equal to or more negative than a potential at one or more load terminals of the one or more GaN devices. In other examples, potential V− increases the quantity of the electrons being repelled from the GaN substrate to the AlGaN layer of the one or more GaN devices.

Input links 24A and 24B may provide a substantially constant potential, such as potential V−. In some examples, input links 24 may provide a substantially constant potential, such as potential V− to one or more diodes (not shown). In other examples, input links 24 may provide alternating potentials, such as positive potential V+ and potential V− to one or more diodes (not shown); however, the diodes may apply only a substantially constant potential V− to common substrate 114. In some examples, links 24 may be a node of the power circuit with a particular potential, potential V−.

Output links 26A and 26B may provide a substantially constant potential, such as potential V−. In some examples, output links 26 may provide a substantially constant potential, such as potential V− to one or more diodes (not shown). In other examples, output links 26 may provide alternating potentials, such as positive potential V+ and potential V− to one or more diodes (not shown), while the diodes apply only a substantially constant potential V− to common substrate 114. In some examples, links 26 may be a node of the power circuit with a particular potential, potential V−.

Semiconductor body 111 includes GaN substrate 112 overlaid, and adjacent to common substrate 114, and represents a combination of semiconductor materials being used to support a GaN device, such as one or more GaN devices 110. In some examples, semiconductor body 111 may have a combination of one or more GaN switches, GaN bidirectional switches, GaN diodes, non-GaN switches, non-GaN bidirectional switches, non-GaN diodes, and the like on common substrate 114.

One or more GaN devices 110 may represent one or more GaN switches, and/or one or more GaN bidirectional switches, and/or one or more GaN diodes. GaN devices 110 may be located on common substrate 114. In yet other examples, GaN devices 110 may not be located on a common substrate in its semiconductor structure, but may instead be located on a common substrate by itself or with other GaN devices. In some examples, GaN devices 110 may have one or more load terminals. In other examples, the one or more load terminals may be one or more drain terminals of the one or more GaN devices, one or more source terminals of the one or more GaN devices, one or more cathode electrodes of the one or more GaN devices, and one or more anode electrodes of the one or more GaN devices. In yet other examples, an electrode of GaN devices may be a node of the power circuit with a particular potential, potential V−. In some examples, the electrode of GaN devices may be at least one of a cathode electrode of a GaN diode or a source electrode of a GaN switch.

GaN substrate 112 is a semiconductor material, such as Gallium Nitride (GaN). In some examples, GaN substrate 112 may be substantially free from impurities. For example, GaN substrate 112 may be made of GaN material that is greater than fifty percent pure GaN. In other examples, GaN substrate 112 may have some impurities due to doping. In one example, GaN substrate 112 may have phosphorous impurities ($2 \times 10^{18}$ cm$^{-3}$) from doping the backside of the GaN substrate.

Common substrate 114 can be formed from one or more semiconductor materials that include silicon (Si), silicon carbide (SiC), sapphire, zinc oxide, and/or the like. In other examples, common substrate 114 may have one or more layers of semiconductor material as necessary to reduce lattice mismatch between common substrate 114 and another substrate, such as GaN substrate 112. In yet other examples, common substrate may have other non-GaN based substrates with other non-GaN based devices. In some examples, common substrate 114 may be electrically coupled at a node of the power circuit, such that the node applies a particular potential, such as potential V−. In other examples, the back side of common substrate 114 may have an electrode that is electrically isolated from each of one or more electrodes of the one or more GaN devices. In yet other examples, a particular potential at the node of the power circuit, such as potential V−, is coupled to the electrode of the common substrate, and the particular potential (e.g., potential V−) increases a quantity of the electrons being repelled from the GaN substrate to the AlGaN layer.

In some examples of FIG. 2, one or more input terminals 20 and/or output terminals 22 may be electrically connected to semiconductor body 111 (e.g., the backside of semiconductor body 111), by, respectively, optional input terminal links 24 and optional output terminal links 26. In other examples, one or more input terminals 20 and/or output terminals 22 may be electrically connected to one or more diodes on semiconductor body 111 (not shown), which are electrically connected to the backside of semiconductor body 111, by, respectively, optional input terminal links 24 and optional output terminal links 26. In yet other examples, the one or more diodes (not shown) may be physically separate from semiconductor body 111. In some examples, one of the optional input terminal links 24 may have a potential V− and may be electrically connected to semiconductor body 111. In other examples, one of the optional output terminal links 26 may have a potential V− and may be electrically connected to semiconductor body 111. In yet other examples, one of the optional input terminals 24 or output terminals 26 may be electrically connected to GaN substrate 112 and/or common substrate 114 (e.g., the backside of common substrate 114).

In accordance with techniques of this disclosure, controller unit 5 may determine a potential V− of power circuit 6 based on information controller unit 5 receives over links 8 and 10. For example, controller unit 5 may receive information indicating that a low potential of power circuit 6 corresponds to a potential of input terminal 20A. Controller unit 5 may apply the low potential of power circuit 6 to common substrate 114. For example, controller unit 5 may cause link 24A to couple or link the potential V− at input terminal 20A to common substrate 114.

In one example, controller unit 5 as described in FIG. 1 may determine a particular potential (e.g., potential V−) at a node of a power circuit that is equal to or more negative than a terminal potential at one or more load terminals of one or more Gallium Nitride (GaN) devices 110, wherein each of one or more GaN devices 110 is included on one or more GaN substrates 112 of semiconductor body 111, one or more GaN substrates 112 being adjacent to a front side of common substrate 114 of semiconductor body 111.

For example, controller unit 5 may receive information via link 8 and/or 10 that indicates a particular potential (e.g., potential V−) of one or more GaN devices 110 of power circuit 6. Based on the information received via link 8 and/or 10, controller unit 5 may provide a command or signal via link 9 to power circuit 6 that causes potential V− of power circuit 6 to be applied to common substrate 114 of semiconductor body 111 of power circuit 6.

Controller unit 5 may apply the particular potential at the node of the power circuit to a common substrate of a semiconductor body, such that the applied particular potential reduces an amount of current collapse in the semiconductor body. For example, controller unit 5 may apply the particular potential (e.g., potential V−) at the node (e.g., input terminals 20, output terminals 22) of the power circuit to common substrate 114 of semiconductor body 111, such that the applied particular potential (e.g., potential V−) reduces an amount of current collapse in semiconductor body 111.

In some examples, the semiconductor body at which controller unit 5 applies the particular potential comprises the one or more GaN devices, the one or more GaN devices include one or more GaN substrates adjacent to a front side of the common substrate of the semiconductor body, and the applied particular potential at the node of the power circuit is equal to or more negative than a potential at the one or more load terminals. In other words, semiconductor body 111 at which controller unit 5 applies (links 24, 26) the particular potential (e.g., potential V−) comprises one or more GaN devices 110, one or more GaN devices 110 include one or more GaN substrates 112 adjacent to a front side of common substrate 114 of semiconductor body 111, and applied particular potential (e.g., potential V−) at the node (e.g., input terminals 20, output terminals 22) of the power circuit is equal to or more negative than a potential at the one or more load terminals (e.g., a drain or source terminal of a GaN switch, a cathode or an anode of a GaN diode) of one or more GaN devices 110.

In some examples, controller unit 5 may apply the particular potential at the node of the power circuit by electrically coupling an input potential of an input terminal of the power circuit or an output potential of an output terminal of the power circuit to the common substrate. In other words, controller unit 5 may apply potential V− by electrically coupling (e.g., links 24, 26) input terminals 20 or output terminals 22 to common substrate 114 of semiconductor body 111.

In other examples, controller unit 5 may apply the particular potential at the node of the power circuit by configuring the one or more Gallium Nitride (GaN) devices to electrically couple an input potential of an input terminal of the power circuit or an output potential of an output terminal of the power circuit to the common substrate. For example, controller unit 5 may apply potential V− by configuring one or more GaN devices 110 to electrically couple (e.g., links 24, 26) input terminals 20 or output terminals 22 to common substrate 114 of semiconductor body 111.

In yet other examples, controller unit 5 may apply the particular potential at the node of the power circuit by configuring one or more non-Gallium Nitride (non-GaN) devices to electrically couple a potential of an input terminal of the power circuit or an output terminal of the power circuit to the common substrate. For example, controller unit 5 may apply potential V− by configuring one or more non-GaN devices (e.g., diodes, switches, bidirectional switches, etc.) to electrically couple (e.g., links 24, 26) input terminals 20 or output terminals 22 to common substrate 114 of semiconductor body 111.

GaN devices 110 may rely on a combination of a GaN substrate and a common substrate (e.g., a Silicon (Si) substrate, a Silicon-Carbide (SiC) substrate, or other similar type of substrate made from a material that exhibits similar electrical and chemical properties as Si or SiC) to improve performance of the semiconductor device over other types of semiconductor devices without increasing cost. However, semiconductor devices, such as GaN devices 110 that rely on a combination of a GaN substrate and a common substrate may suffer from an abnormally high rate of traps. Having a high rate of traps may render the GaN based semiconductor device to be ineffective and unusable as a High Electron Mobility Effect Transistors (HEMT). For example, current collapse in a GaN based semiconductor body with GaN devices 110 can increase $R_{DSON}$ of the GaN devices 110 by a factor of 100, and in effect, render GaN devices 110 useless for most HEMT applications. However, by applying potential V− to the common substrate to repel electrons away from the backside of common substrate 114 of semiconductor body 111, the current collapse of GaN devices 110 may be reduced and/or eliminated. By reducing and/or eliminating current collapse in GaN devices 110, power circuit 6 may use GaN devices 110 as a high-electron-mobility transistor (HEMT) by itself or with other GaN devices on the common substrate of semiconductor body 111. In some examples, the reduction and/or elimination of the current collapse in GaN devices 110 may also significantly reduce and/or eliminate the increase of $R_{DSON}$.

Figure 3:
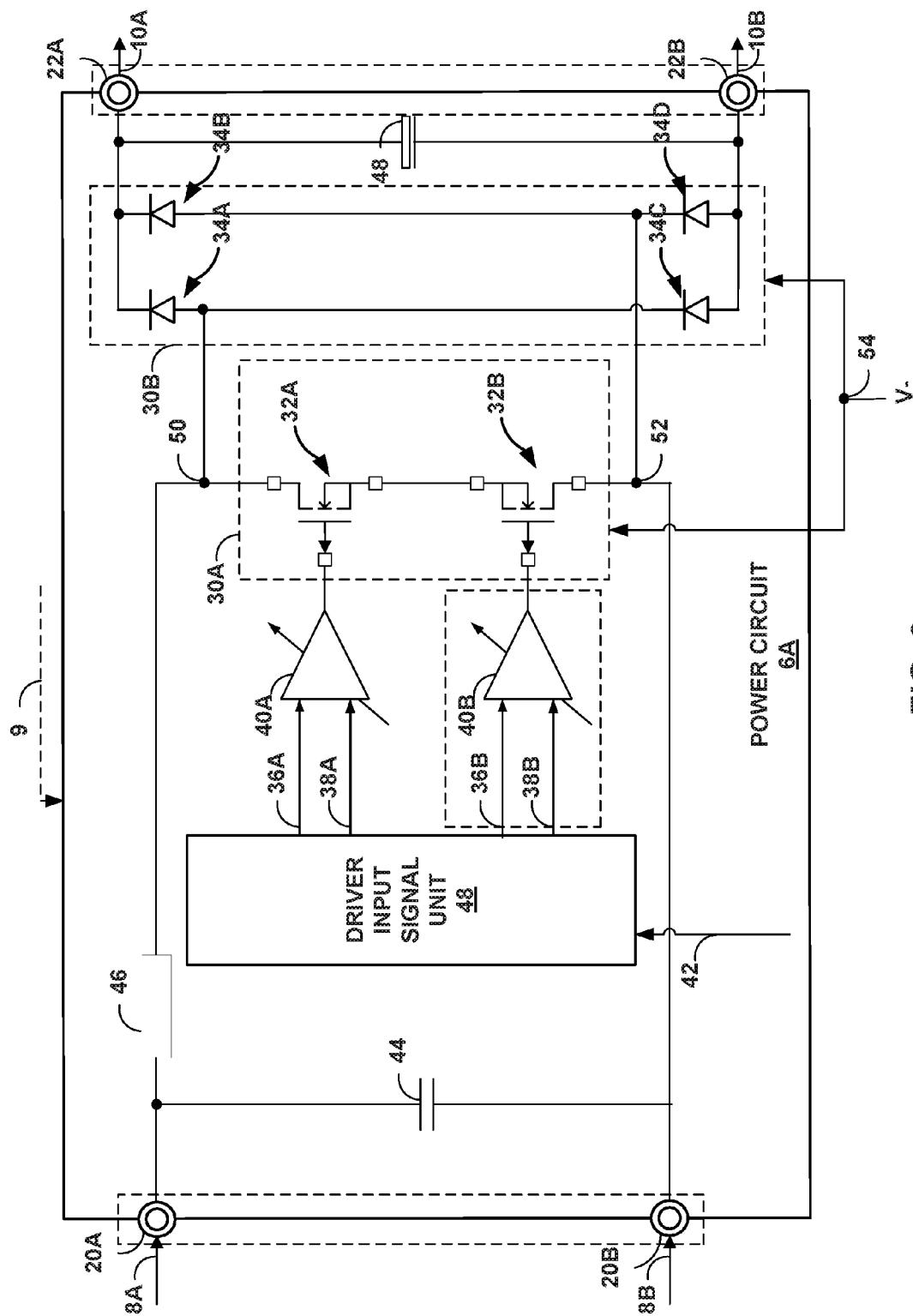
FIG. 3 is a block diagram illustrating an example of a single phase rectifier as one example of the power circuit of FIG. 2.

FIG. 3 is a block diagram illustrating an example of a single phase rectifier as one example of power circuit 6 of FIG. 2. In the example of FIG. 3, power circuit 6A includes input links 8A and 8B of link 8, link 9, and output links 10A and 10B of link 10, link 54, which may correspond to links 24 and/or link 26 with potential V−, input terminals 20, and output terminals 22, as described above in FIGS. 1-2. In the example of FIG. 3, power circuit 6A also includes semiconductor bodies 30A, 30B with GaN devices, such as GaN bidirectional switches 32A, 32B, and GaN diodes 34A-34D. In the example of FIG. 3, GaN bidirectional switches 32A, 32B are driven by drivers 40A, 40 with driver signals 36A, 36B, 38A, 38B from driver input signal unit 48 by driver input 42.

Semiconductor bodies 30A, 30B represent one example of semiconductor body 111, as described in FIG. 2. In some examples, semiconductor bodies 30A, 30B may be on separate GaN substrates and separate common substrates. In other examples, semiconductor bodies 30A, 30B may be on separate GaN substrates, but on a single common substrate. In yet other examples, semiconductor bodies 30A, 30B may be a single GaN substrate, and a single common substrate. In some examples, at least one of input terminals 20 or output terminals 22 may be electrically connected to semiconductor bodies 30A, 30B with a substantially constant potential V−. In other examples, semiconductor bodies 30A, 30B may have one or more GaN devices, such as one or more GaN switches, one or more GaN bidirectional switches, and/or one or more GaN diodes. In yet other examples, semiconductor body 30B may be a silicon-based semiconductor body instead of a GaN-based semiconductor body. In some examples, semiconductor body 30B may include two GaN devices and two non-GaN devices, such as two low frequency diodes 34C and 34D (e.g., operating at 50 Hz) made with silicon, and two high frequency diodes 34A and 34B (e.g., operating at typically 100 kHz) made with GaN. In other examples, semiconductor body 30A may further include one or more non-Gallium Nitride (non-GaN) devices arranged on the front side of the common substrate, wherein the node of the power circuit comprises an electrode of at least one of the one or more non-GaN devices, and wherein the electrode of the at least one of the one or more non-GaN devices comprises at least one of a cathode electrode of a non-GaN diode or a source electrode of a non-GaN switch.

GaN bidirectional switches 32A, 32B may conduct power in either direction when on and isolate the switched terminals when off. GaN bidirectional switches 32A, 32B may correspond to GaN devices 110 as described in FIG. 2. In some examples, GaN bidirectional switches 32A, 32B may be located on top of or overlaid on common substrate 114 and GaN substrate 112 in combination with a plurality of other semiconductor materials to form a layered semiconductor structure. In some examples, GaN switches may be used in place, or in addition to GaN bidirectional switches 32A, 32B.

GaN diodes 34A-34D are semiconductor diodes formed by semiconductor material, include two electrical terminals (e.g., a cathode and an anode) and allow an electric current to pass in one direction, while blocking current in the opposite direction. GaN diodes 34A-34D may correspond to GaN devices 110 as described in FIG. 2. In some examples, GaN diodes 34A-34D may be located on common substrate 114 and GaN substrate 112 in combination with a plurality of other semiconductor materials to form a layered semiconductor structure, such as semiconductor body 111 as described in FIG. 2.

Driver 40A, 40B are gate drivers for controlling a switch, such as bidirectional switches 32A, 32B. Driver 40A is coupled to switch 32A such that an output signal produced by driver 40A may cause bidirectional switch 32A to transition from operating between an on-state and an off-state. In other words, driver 40A may output a driver signal to bidirectional switch 32A that causes bidirectional switch 32A to transition to operating in a "switched-on" state and/or causes switch bidirectional 32A to transition to operating in a "switched-off" state. Driver 40B is coupled to bidirectional switch 32B such that an output signal produced by driver 34B may cause bidirectional switch 32B to transition from operating between an on-state and an off-state. In other words, driver 40B may output a driver signal to bidirectional switch 32B that causes bidirectional switch 32B to transition to operating in a "switched-on" state and/or causes bidirectional switch 32B to transition to operating in a "switched-off" state.

Driver input signal unit 48 is used by power circuit 6, as described in FIG. 1, to provide a drive strength signal and a suitable driver signal for causing drivers 40A, 40B to cause bidirectional switches 32A, 32B to turn-on and/or turn-off in order to rectify an AC voltage of a power input to be delivered as a DC voltage of a power output at output terminals 22. Driver input signal unit 48 may detect a voltage level at semiconductor body 30A (e.g., a potential between nodes 50, 52) and receive a driver signal via link 42. Driver input signal unit 48 may provide a drive strength signal (based at least in part on the voltage level at semiconductor body 30A) over link 36A to driver 40A and over link 36B to driver 40B. Driver input signal unit 48 may provide a driver signal (based at least in part on the driver signal received over link 42) over link 38A to driver 40A and over link 38B to driver 40B. The signals outputted by driver input signal unit 48 via links 36A, 38A may cause driver 40A to cause bidirectional switch 32A to transition from operating between an on-state and an off-state and the signals outputted by driver input signal unit 48 via links 36B, 38B may cause driver 40B to cause bidirectional switch 32B to transition from operating between an on-state and an off-state.

In some examples, semiconductor bodies 30A, 30B may each have an individual common substrate. In other examples, semiconductor bodies 30A, 30B may have a common substrate. In yet other examples, bidirectional switches 32A, 32B may each be on an individual common substrate. In some examples, bidirectional switches 32A, 32B may be on a common substrate. In other examples, diodes 34A-34D, and bidirectional switches 32A, 32B may be located on a common substrate. In yet other examples, any number of diodes and/or bidirectional switches may be on a common substrate.

For example, controller unit 5 may receive information via link 8 and/or 10 that indicates a low potential of power circuit 6A. Based on the information received via link 8 and/or 10, controller unit 5 may provide a command or signal via link 9 to power circuit 6A that causes potential V− of power circuit 6A to be applied to a common substrate of a semiconductor body 30A of power circuit 6A. In some examples, potential V− may be delivered by link 54 directly from an input terminal or an output terminal, such as input terminals 20 and output terminals 22, as described in FIG. 2 to a common substrate (e.g., backside of the common substrate, common substrate 114 as described in FIG. 2) containing any number of GaN devices, such as diodes, switches, and bidirectional switches. In other examples, potential V− may be delivered by from an input terminal or an output terminal, such as input terminals 20 and output terminals 22, as described in FIG. 2 to one or more diodes, which are electrically connected to a common substrate by link 54 (e.g., to the backside of the common substrate) containing any number of GaN device, such as diodes, switches, and bidirectional switches. In some examples, the diodes electrically connected to the common substrate may be located on the common substrate.

Figure 4A:
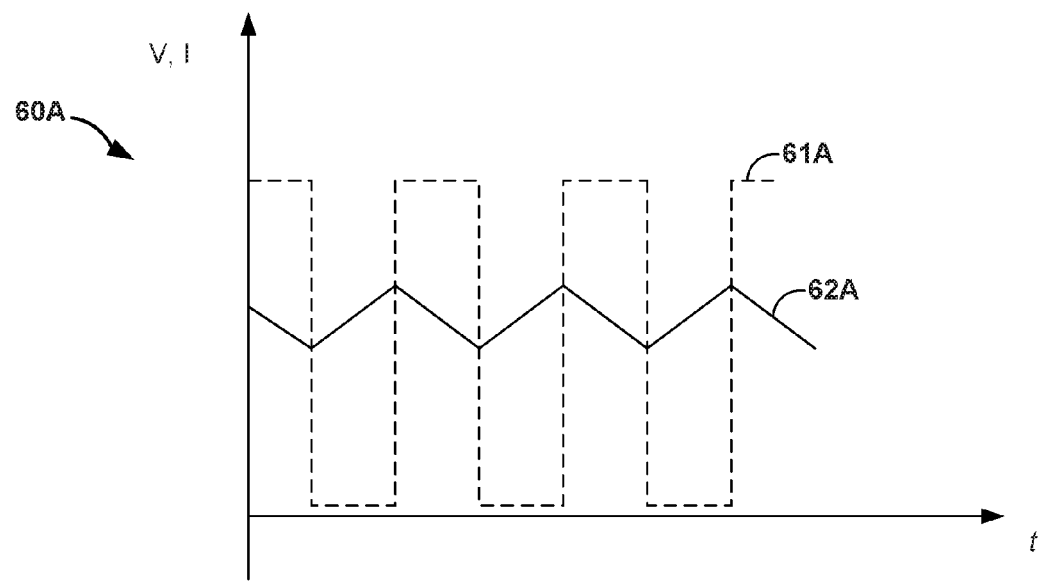
FIGS. 4A-4B are conceptual diagrams illustrating examples of the voltage difference between nodes and the current flow through a semiconductor body of an example power circuit 6A as shown in FIG. 3.
Figure 4B:
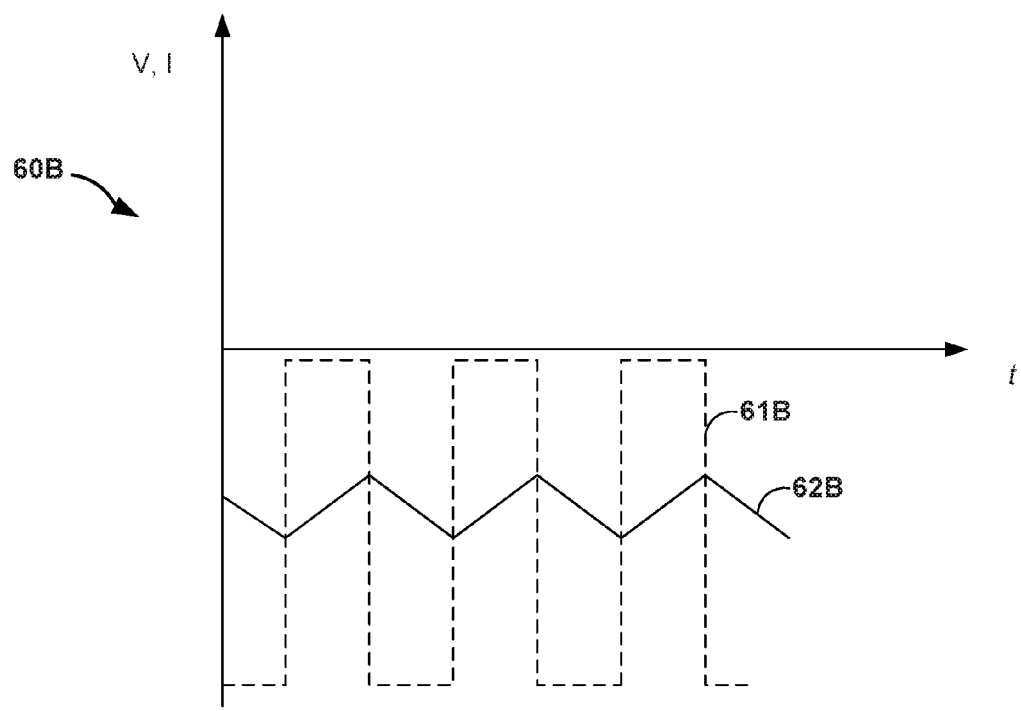

FIGS. 4A-4B are conceptual diagrams illustrating examples 60A and 60B of the voltage difference between nodes 50 and 52 and the current flow through semiconductor body 30A of an example power circuit 6A as shown in FIG. 3. In the example of FIG. 4A, example 60A corresponds to the voltage difference between nodes 50 and 52 at positive line voltage, (e.g., there is a positive voltage at link 20A relative to 20B). In the example of FIG. 4A graph 61A shows the voltage and graph 62A shows the current.

In the example of FIG. 4B, example 60B corresponds to the voltage difference between nodes 50 and 52 at negative line voltage (e.g., there is a negative voltage at link 20A relative to 20B). In the example of FIG. 4B, graph 61B represents the voltage and graph 62B represents the current.

In some examples, timing diagrams 60A, 60B demonstrate that power circuit 6A using GaN devices, such as bidirectional switches 32A, 32B, frequently change polarity, and neither of the two power terminals (e.g., nodes 50, 52, as described in FIG. 3) of a bidirectional switch arrangement provide a substantially constant low potential, such as potential V− as described in FIG. 2, throughout the operation of the bidirectional switch. In other examples, diodes (not shown) may be used in combination with the potentials available at nodes 50, 52 to provide a substantially constant low potential, such as potential V−.

Figure 5:
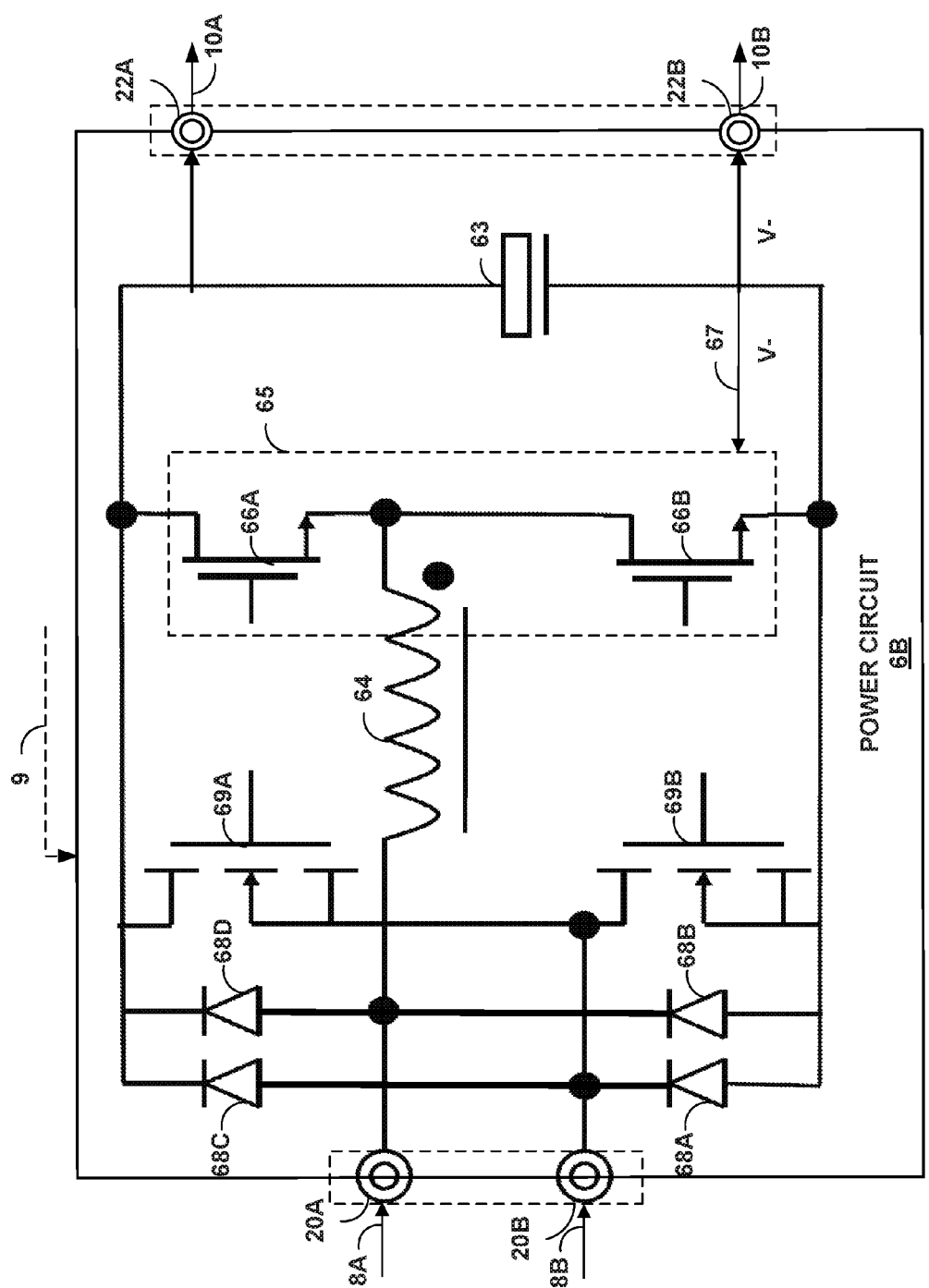
FIG. 5 is a block diagram illustrating an example of a totem pole power factor correction stage as an additional example of the power circuit of FIG. 2.

FIG. 5 is a block diagram illustrating an example of a totem pole power factor correction stage (totem pole PFC) of power circuit 6B of FIG. 2. FIG. 5 is described below within the context of system 1 of FIG. 1 and power circuit 6 of FIG. 2.

In the example of FIG. 5, the totem pole PFC of power circuit 6B includes links 8A and 8B of link 8, link 9, and links 10A and 10B of link 10, input terminals 20, and output terminals 22 as described in FIG. 2. In addition, power circuit 6B includes semiconductor body 65, GaN switches 66A, 66B, link 67 with potential V−, diodes 68A-68D, inductor 64, and capacitor 63. Semiconductor body 65 may correspond to semiconductor bodies 110, 30A, 30B as described in FIGS. 2-3, GaN switches 66A and 66B may correspond to GaN devices 110 as described in FIG. 2, link 67 may correspond to links 24, 26 as described in FIG. 2, and diodes 68A-68D may correspond to GaN diodes 34A-34D as described in FIG. 3.

In the example of FIG. 5, power circuit 6B may consist of semiconductor body 65 with two GaN switches 66A and 66B being coupled to inductor 64, which is coupled to the link 8A at input terminal 20A between diodes 68B and 68D. In some examples, at positive line voltage GaN switch 66B may act as a switch and GaN switch 66A may act as a synchronous rectifying element (diode). In other examples, at negative voltage, GaN switch 66A may act as an active switch and GaN switch 66B may act as the synchronously controlled diode. In the example of FIG. 5, potential V− at output terminal 22B is identical to the source potential of GaN switch 66B and is connected to the common substrate of semiconductor body 65 by link 67 (e.g., to the backside of common substrate 114 as described in FIG. 2). In some examples, semiconductor body 65 may have a common substrate including one or more GaN devices, such as GaN switches 66A and 66B. In yet other examples, a low potential of any input terminals 20 or output terminals 22 may be electrically coupled to the common substrate of semiconductor body 65, to provide potential V−. In some examples, diodes such as GaN diodes 34A-34D may be used to electrically couple potential V− from any of input terminals 20 or output terminals 22 to the common substrate. In other examples, capacitor 63 may be used to filter the output, such as potential V− to output terminals 22 and links 10. In yet other examples, inductor 64 may be used to filter the AC input from a power source, such as power source 2 as described in FIG. 1.

Switches 69A and 69B are optional and may provide a low-ohmic current path parallel to diodes 68A and 68D, which may help to lower the forward voltage drop, and yield a better efficiency of the circuit. In some examples, switches 69A and 69B may be superjunction devices and made of silicon. In other examples, switches 69A and 69B may be superjunction devices and made of GaN.

Diodes 68B and 68C are protection diodes coupling input terminals 20A and 20B toward the output capacitor to handle surge currents and/or rush-in currents during a power-up sequence.

Figure 6:
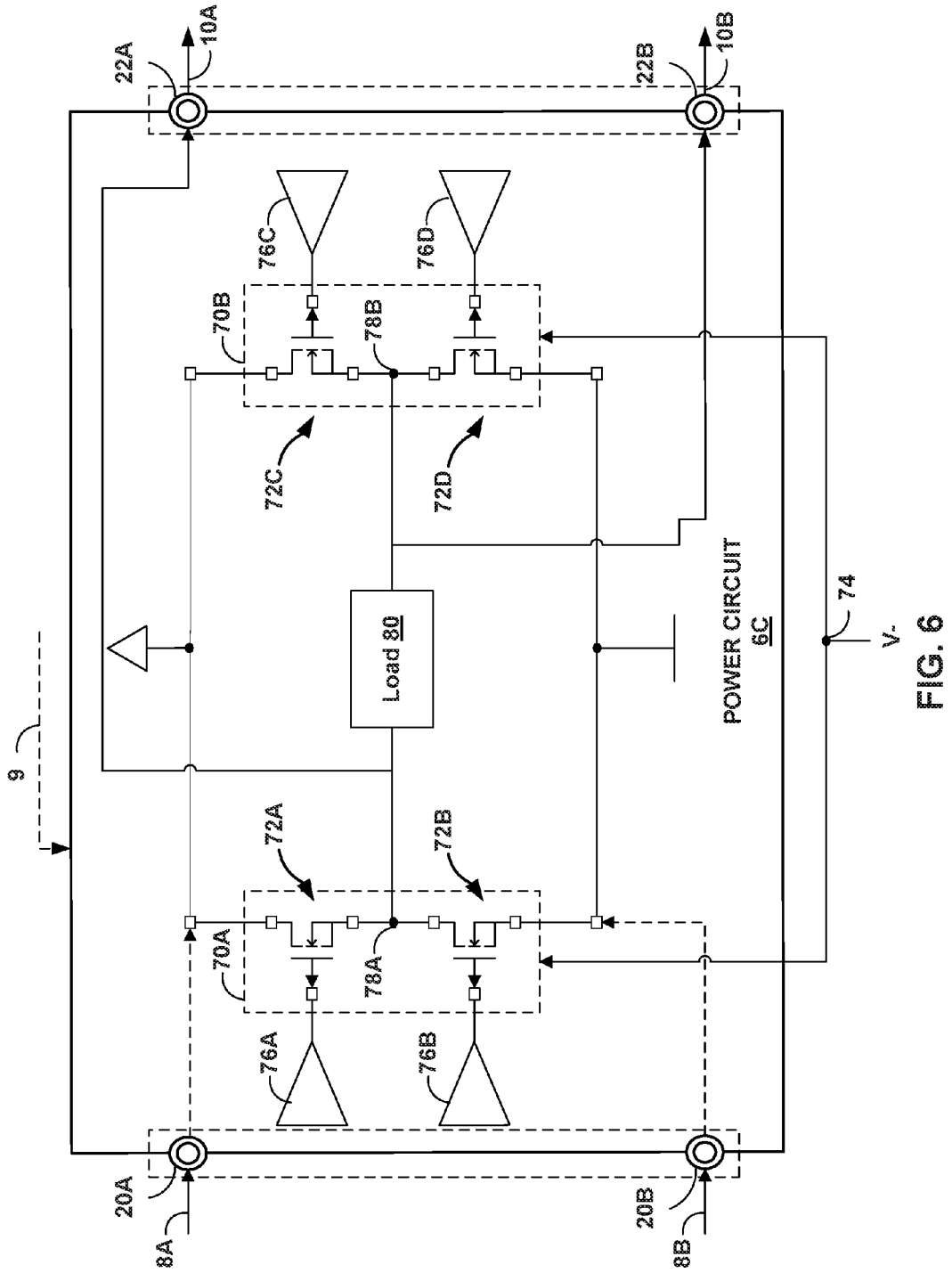
FIG. 6 is a block diagram illustrating an example of an inverter as an additional example of the power circuit of FIG. 2.

FIG. 6 is a block diagram illustrating an example of an inverter as an additional example of power circuit 6C of FIG. 2. FIG. 6 is described below within the context of system 1 of FIG. 1.

In the example of FIG. 6, the inverter of power circuit 6C includes links 8A and 8B of link 8, link 9, and links 10A and 10B of link 10, input terminals 20, and output terminals 22 as described in FIG. 2. In the example of FIG. 6, the inverter of power circuit 6C includes drivers 76A-76D, which may correspond to drivers 40A, 40B as described in FIG. 3. Power circuit 6C also includes link 74, which may correspond to links 24 and/or links 26. In addition, power circuit 6C includes potential V− and semiconductor bodies 70A, 70B. Semiconductor bodies 70A, 70B may correspond to semiconductor bodies 110, 30A, 30B as described in FIGS. 2-3. In the example of FIG. 6, semiconductor bodies 70A, 70B may include GaN switches and/or GaN diodes in a half-bridge configuration and/or a H-bridge configuration, along with switching nodes 78A, 78B.

In some examples, GaN switches 72A and 72B may block in the same direction (see semiconductor body 111C of FIG. 9C). In the example of FIG. 6, the low potential, such as potential V−, is the source potential of the low side switch in each half bridge, such as GaN switches 72B and 72D respectively. In some examples, potential V− coupled to the common substrate of semiconductor bodies 70A, 70B may be the source potential of the two low side GaN switches 72B, 72D, which is the potential at link 20B.

The h-bridge configuration of inverter 70 is made of two half-bridge circuits that are coupled to load 80 including an inductor (not shown in FIG. 6) at each of their respective switching nodes. In other words, the h-bridge of inverter 70 includes first and second drivers 76A, 76B for controlling, respectively, a first switch 72A coupled to a second switch 72B at a first switching node 78A of a first half-bridge and third and fourth drivers 76C, 76D for controlling a third switch 72C coupled to a fourth switch 72D at a second switching node 78B of a second half-bridge. The first and second switching nodes 78A, 78B of the h-bridge of inverter 70 form an output port. A first terminal 22A of the output port corresponds to first switching node 78A and a second terminal 22B of the output port corresponds to second switching node 78B. Load 80 is coupled to both first switching node 78A of the first half-bridge and second switching node 78B of the second half-bridge at first terminal 22A and second terminal 22B of the output port. A current may travel between load 80 and first switching node 78A of power circuit 6C and may further travel between load 80 and second switching node 78B of power circuit 6C.

In accordance with the techniques and circuits described herein, drivers 76A, 76B of the first half-bridge of power circuit 6C may control the amount of time that both first switch 72A of power circuit 6C and second switch 72B of power circuit 6C transition from off-states to on-states and from on-states to off-states based on a voltage at the first half-bridge of power circuit 6 when currents travel between first switching node 78A of power circuit 6C and load 80 to prevent overshoots that may occur at either first switch 72A of power circuit 6C or the second switch 72B of power circuit 6C. Alternatively or additionally, in accordance with the techniques and circuits described herein, drivers 76C, 76D of the second half-bridge of power circuit 6C may control the amount of time that both third switch 72C of power circuit 6C and fourth switch 72D of power circuit 6C transition from off-states to on-states and from on-states to off-states based on a voltage at the second half-bridge of power circuit 6C when currents travel between second switching node 78B of power circuit 6C and load 4 to prevent overshoots that may occur at either third switch 72C of power circuit 6C or fourth switch 72D of power circuit 6C.

In some examples, semiconductor bodies 70A, 70B may each be on an individual common substrate. In other examples, semiconductor bodies 70A, 70B may be on a common substrate. In yet other examples, GaN switches 72A-72D are on two separate power devices per half bridge, such as semiconductor bodies 70A, 70B, both GaN switches having the same blocking direction and each may be on an individual common substrate. In some examples, GaN switches 72A-72D may be on a common substrate. In other examples, a pair of diodes, and GaN switches 72A-72B may be located on a common substrate. Various examples may exist that include any number of diodes and/or GaN switches may be on a common substrate.

For example, controller unit 5 may receive information via link 8 and/or 10 that indicates a low potential of power circuit 6C. Based on the information received via link 8 and/or 10, controller unit 5 may provide a command or signal via link 9 to power circuit 6C that causes the low potential of power circuit 6C to be applied to a common substrate of a semiconductor device of power circuit 6C. In some examples, a potential V− may be delivered by link 74 directly from an input terminal or an output terminal, such as input terminals 20 and output terminals 22, as described in FIG. 2 to a common substrate (e.g., backside of the common substrate, common substrate 114 as described in FIG. 2) containing any number of GaN devices, such as diodes, switches, and bidirectional switches. In other examples, a potential V− may be delivered by from an input terminal or an output terminal, such as input terminals 20 and output terminals 22, as described in FIG. 2 to one or more diodes, which are electrically connected to a common substrate by link 74 (e.g., to the backside of the common substrate) containing any number of GaN device, such as diodes, switches, and bidirectional switches. In some examples, the diodes electrically connected to the common substrate may be located on the common substrate.

Figure 7:
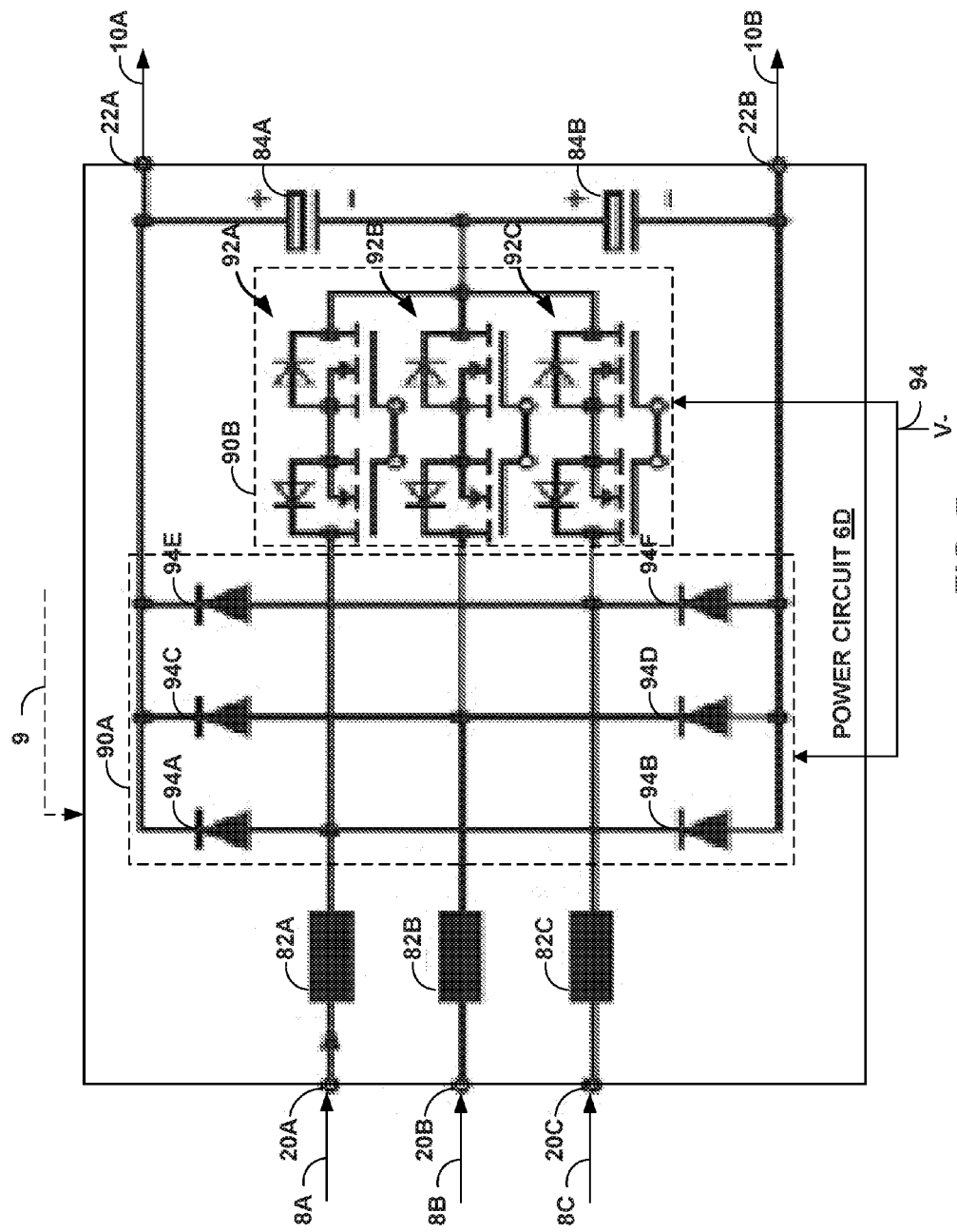
FIG. 7 is a block diagram illustrating an example of a three phase Vienna rectifier as an additional example of the power circuit of FIG. 2.

FIG. 7 is a block diagram illustrating an example of a three phase Vienna rectifier as an additional example of power circuit 6D of FIG. 2. FIG. 7 is described below within the context of system 1 of FIG. 1.

In the example of FIG. 7, power circuit 6D includes input terminals 20 receiving power from links 8A-8C of link 8, link 9, and output terminals 22 outputting power to links 10A-10B of link 10, as described in FIGS. 1-2. In the example of FIG. 7, power circuit 6D also includes inductors 82A-82C, capacitors 84A-84B, along with diodes 94A-94F and bidirectional switch pairs 92A-92C, which may correspond to the diodes and bidirectional switches, as described in FIG. 3, such as diodes 34A-34D, and bidirectional switches 32A-32C. In addition, power circuit 6D also includes potential V−, applied and/or electrically connected to the common substrate (not shown) of semiconductor bodies 90A, 90B, which may correspond to semiconductor body 111, by link 94, which may correspond to links 24 and/or links 26, as described in FIG. 2.

Inductors 82A-82C are a passive two-terminal electrical component that each resist changes in electric current passing through the component. In some examples, inductors 82A-82C may be used for inductive filtering to alter the current waveform to more closely resemble a sine wave.

Capacitors 84A-84B are a passive two-terminal electrical component used to store energy electrostatically in an electric field. In some examples, capacitors 84A-84B may be used for filtering to achieve a smooth DC voltage at an output.

In the example of FIG. 7, power circuit 6D receives AC current from power received at links 8A-8C of link 8 to inductors 82A-82C. Inductors 82A-82C filter the AC current and delivers the filtered current to a pair of diodes connected in parallel to inductors 82A-82C and a pair of bidirectional switches connected in series to inductors 82A-82C. In one example of FIG. 7, inductor 82A may deliver AC current to diodes 96A and 96B, and deliver AC current to bidirectional switch pair 92A. In some examples, after rectification, capacitors 84A-84B filter the DC voltage based on the AC current received at inductors 82A-82C to provide a smooth or filtered DC voltage output, such as an output to links 10A, 10B of link 10 from output terminals 22.

In some examples, diodes 94A-94F may each be on an individual substrate. In other examples, diodes 94A-94F may all be on a common substrate of semiconductor body 90A. In yet other examples, bidirectional switch pairs 92A-92C may each be on an individual substrate. In some examples, bidirectional switch pairs 92A-92C may all be on a common substrate of semiconductor body 90B. In other examples, a pair of diodes, such as diodes 94A, 94B, and a bidirectional switch pair, such as bidirectional switch pair 92A may be located on a common substrate of semiconductor body 90. In yet other examples, any number of diodes and/or bidirectional switches may be on a common substrate.

For example, controller unit 5 may receive information via link 8 and/or 10 that indicates a low potential of power circuit 6D. Based on the information received via link 8 and/or 10, controller unit 5 may provide a command or signal via link 9 to power circuit 6D that causes the low potential of power circuit 6D to be applied to a common substrate of a semiconductor device of power circuit 6D. In some examples, potential V− may be delivered directly from an input terminal or an output terminal, such as input terminals 20 and output terminals 22, as described in FIG. 2 to a common substrate (e.g., to the backside of common substrate 114, as described in FIG. 2) containing any number of GaN devices, such as diodes, switches, and bidirectional switches. In other examples, potential V− may be delivered from an input terminal or an output terminal, such as input terminals 20 and output terminals 22, as described in FIG. 2 to one or more diodes, which are electrically connected to a common substrate (e.g., to the backside of common substrate 114, as described in FIG. 2) containing any number of GaN device, such as diodes, switches, and bidirectional switches. In some examples, the diodes electrically connected to a common substrate may be located on the common substrate.

Figure 8A:
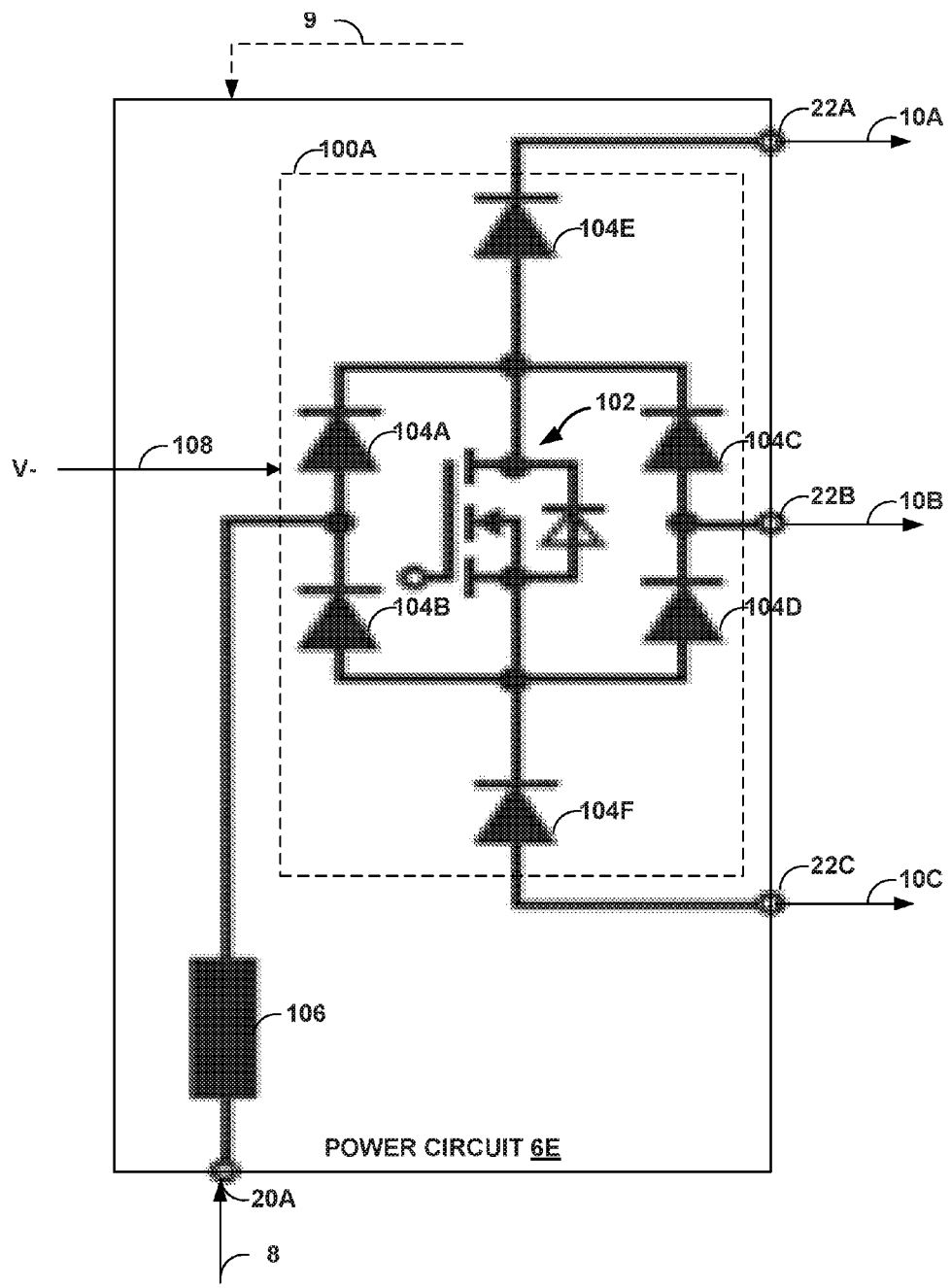
FIGS. 8A-8C are block diagrams each illustrating an example of a single phase Vienna rectifier as an additional example of the power circuit of FIG. 2.
Figure 8B:
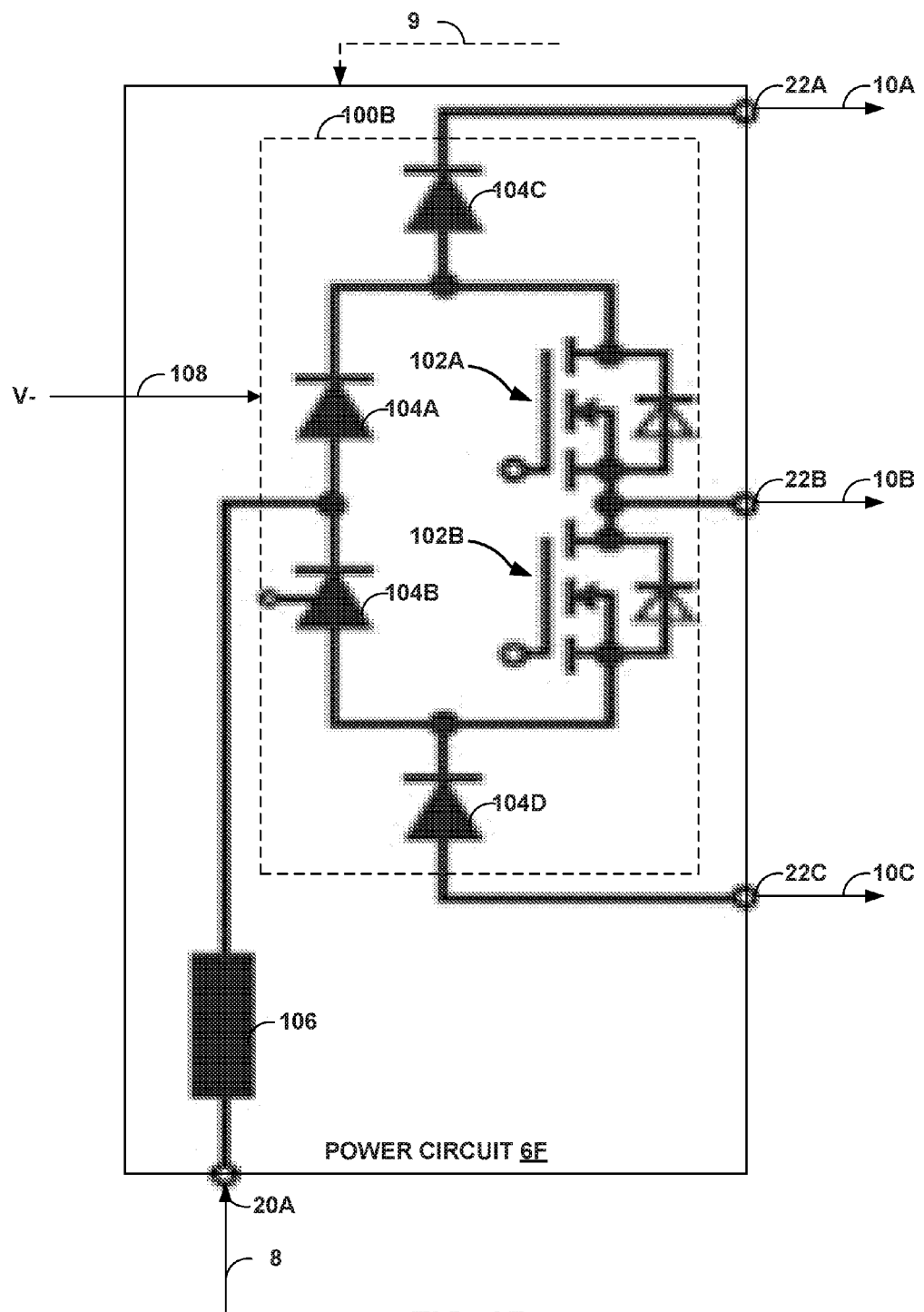
Figure 8C:
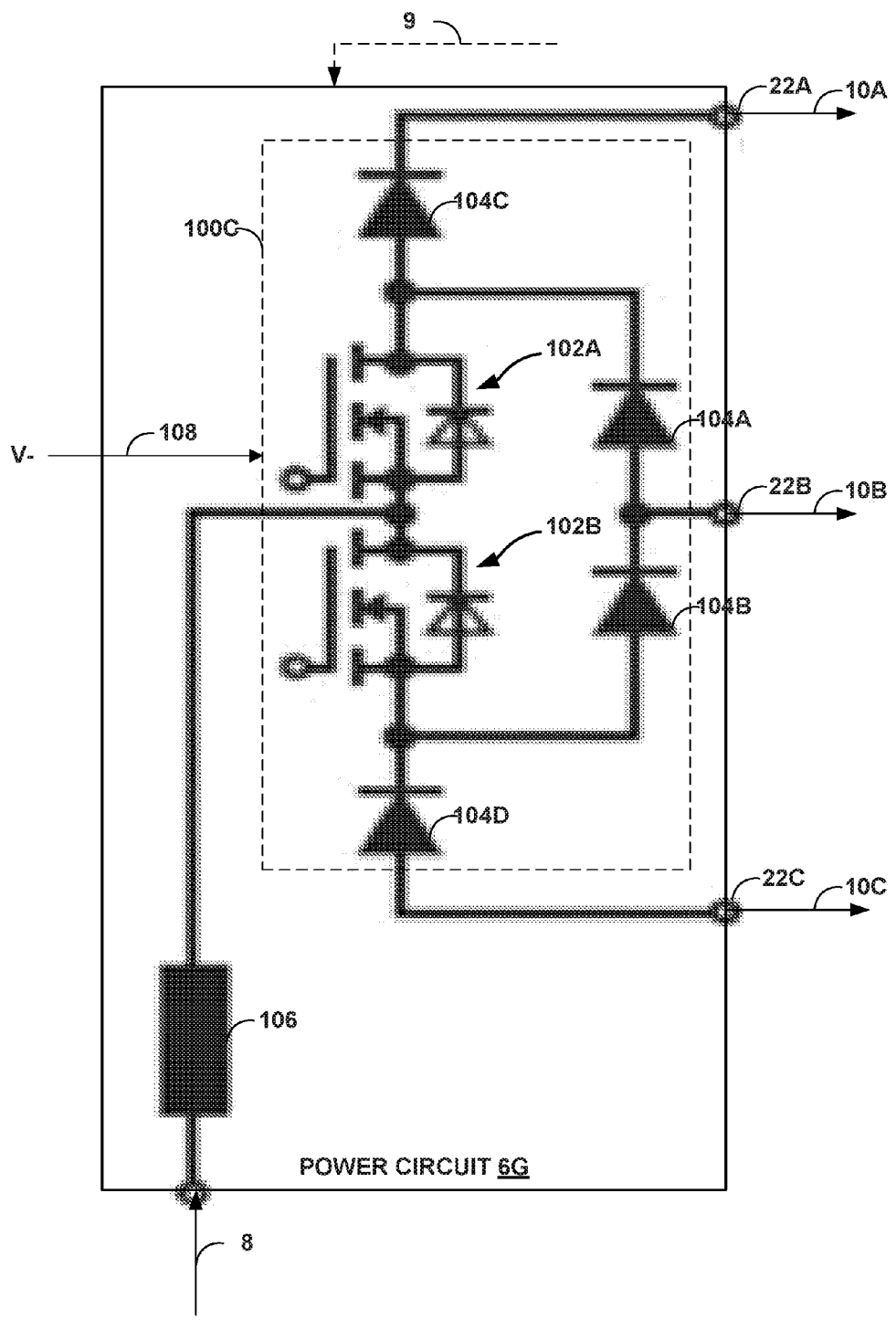

FIGS. 8A-8C are block diagrams each illustrating an example of a single phase rectifier as an additional example of power circuit 6E-6G of FIG. 2. In the example of FIGS. 8A-8C, single phase rectifiers of power circuits 6E, 6F, and 6G, respectively, include input terminals 20 for receiving power from link 8, link 9, and output terminals 22 for outputting power to links 10A-10C of link 10, as described in FIGS. 1-2. In the example of FIGS. 8A-8C, the rectifier also includes inductors 106A-106C, along with diodes 104A-104F and switch pairs 102A, 102B, which may correspond to the diodes and switches, as described in FIGS. 3, 6, and 7 such as diodes 34A-34D, 96A-96F and switches 72A-72D. In the example of FIGS. 8A-8C, the rectifier also includes potential V− applied and/or electrically connected to semiconductor bodies 100A-100C by link 108, which may correspond to links 24, 26 as described in FIG. 2. In some examples, FIGS. 8A-8C are alternative topologies without bidirectional switches as described in FIG. 7.

Inductors 106A-106C are each a passive two-terminal electrical component that each resist changes in electric current that passes through each component. In some examples, inductors 106A-106C may be used for inductive filtering to alter a current level, such as to more closely resemble the current level of an AC current.

In the example of FIG. 8A, power circuit 6D has AC power delivered by link 8 to inductor 106, which filters the current level of the AC power and delivers the filtered current level of the AC power between a first pair of diodes 104A, 104B connected in parallel with switch 102A, which is connected in parallel with a second pair of diodes 104C, 104D, and connected in series between a third pair of diodes 104E, 104F. In the example of FIG. 8A, after rectification, output terminal 22A receives power from diode 104E, output terminal 22B receives power from between diodes 104C, 104D, and output terminal 22C receives power from diode 104F.

In some examples, diodes 104A-104D may each be on an individual common substrate. In other examples, diodes 104A-104D may all be on a common substrate, such as common substrate 114 as described in FIG. 2. In yet other examples, switch 102A may be on an individual common substrate. In other examples, a pair of diodes, such as diodes 104A, 104B, and switch 102A may be located on a common substrate of semiconductor body 100A, such as common substrate 114 as described in FIG. 2. It is contemplated in this disclosure that any number of GaN devices, such as diodes and/or switches may be on common substrate 114 on semiconductor body 111, as described in FIG. 2.

For example, controller unit 5 may receive information via link 8 and/or 10 that indicates a low potential of power circuit 6D. Based on the information received via link 8 and/or 10, controller unit 5 may provide a command or signal via link 9 to power circuit 6D that causes the low potential of power circuit 6D to be applied to a common substrate of a semiconductor device of power circuit 6D. In some examples, a potential V− may be delivered by link 108, which may correspond to links 24 and/or output links 26 as described in FIG. 2, to a common substrate (e.g., the backside of common substrate 114 as described in FIG. 2) containing any number of GaN devices, such as diodes, switches, and switch pairs. In other examples, a potential V− may be delivered from an input terminal or an output terminal, such as input terminals 20 and output terminals 22, as described in FIG. 2 to one or more diodes, which are electrically connected to a common substrate (e.g., the backside of common substrate 114, as described in FIG. 2) by link 108, which may correspond to links 24 and/or links 26 as described in FIG. 2. In some examples, the diodes electrically connected to a common substrate may be located on a common substrate with the GaN device(s). In other examples, the diodes may be non-GaN based diodes on the common substrate. In yet other examples, the diodes may receive an alternating positive and low potential, while the diodes apply only potential V− to the common substrate.

In the example of FIG. 8B, power circuit 6E has AC power is delivered by link 8 to inductor 106, which filters the current level of the AC power and delivers the filtered current level of the AC power between a first pair of diodes 104A, 104B connected in parallel with a pair of switches 102A, 102B having the same polarity, which are connected between a second pair of diodes 104C, 104D. In the example of FIG. 8B, after rectification, output terminal 22A receives power from diode 104C, output terminal 22B receives power from between switches 102A, 102B, and output terminal 22C receives power from diode 104D.

In some examples, diodes 104A-104D may each be on an individual common substrate. In other examples, diodes 104A-104D may all be on a common substrate, such as common substrate 114, as described in FIG. 2. In yet other examples, switches 102A, 102B may each be on an individual common substrate. In other examples, a pair of diodes, such as diodes 104A, 104B, and switches 102A, 102B may be located on a common substrate of semiconductor body 100B, such as common substrate 114. In yet other examples, any number of diodes and/or switches may be on common substrate 114, as described in FIG. 2. It is contemplated in this disclosure that any number of GaN devices, such as diodes and/or switches may be on common substrate 114 of semiconductor body 111, as described in FIG. 2.

For example, controller unit 5 may receive information via link 8 and/or 10 that indicates a low potential of power circuit 6E. Based on the information received via link 8 and/or 10, controller unit 5 may provide a command or signal via link 9 to power circuit 6E that causes the low potential of power circuit 6E to be applied to a common substrate of a semiconductor device of power circuit 6E. In some examples, potential V− may be delivered by link 108 directly from links 24 and/or links 26 as described in FIG. 2 to a common substrate (e.g., the backside of common substrate 114, as described in FIG. 2) containing any number of GaN devices, such as diodes, switches, and switch pairs. In other examples, a potential V− may be delivered from an input terminal or an output terminal, such as input terminals 20 and output terminals 22, as described in FIG. 2 to one or more diodes (not shown), which are electrically connected to a common substrate by link 108 directly from links 24 and/or links 26 as described in FIG. 2. In some examples, the diodes electrically connected to a backside of a common substrate may be located on a common substrate with the GaN device(s). In other examples, the diodes may be non-GaN based diodes on the common substrate. In yet other examples, the diodes may receive an alternating positive and low potential, while the diodes apply only potential V− to the common substrate.

In the example of FIG. 8C, power circuit 6D has AC power delivered by link 8 to inductor 106, which filters the current level of the AC power and delivers the filtered current level of the AC power between a pair of switches 102A, 102B having the same polarity connected in parallel with a first pair of diodes 104A, 104B, and in series between a second pair of diodes 104C, 104D. In the example of FIG. 8C, after rectification, output terminal 22A receives power from diode 104C, output terminal 22B receives power from between diodes 104A, 104B, and output terminal 22C receives power from diode 104D.

In some examples, diodes 104A-104D may each be on an individual common substrate. In other examples, diodes 104A-104D may all be on a common substrate, such as common substrate 114, as described in FIG. 2. In yet other examples, switches 102A, 102B may each be on an individual common substrate. In other examples, a pair of diodes, such as diodes 104A, 104B, and switches 102A, 102B may be located on a common substrate of semiconductor body 100C, such as common substrate 114, as described in FIG. 2. It is contemplated in this disclosure that any number of GaN devices, such as diodes and/or switches may be on common substrate 114 of semiconductor body 111, as described in FIG. 2. For example, controller unit 5 may receive information via link 8 and/or 10 that indicates a low potential of power circuit 6F. Based on the information received via link 8 and/or 10, controller unit 5 may provide a command or signal via link 9 to power circuit 6F that causes the low potential of power circuit 6F to be applied to a common substrate of a semiconductor device of power circuit 6F. In some examples, potential V− may be delivered by link 108 directly from links 24 and/or links 26 as described in FIG. 2 to a common substrate (e.g., the backside of common substrate, as described in FIG. 2) containing any number of GaN devices, such as diodes, switches, and switch pairs. In other examples, potential V− may be delivered from an input terminal or an output terminal, such as input terminals 20 and output terminals 22, as described in FIG. 2 to one or more diodes (not shown), which are electrically connected to a common substrate (e.g., the backside of common substrate 114, as described by FIG. 2) by link 108 directly from links 24 and/or links 26 as described in FIG. 2. In some examples, the diodes electrically connected to a backside of a common substrate may be located on a common substrate with the GaN device(s). In other examples, the diodes may be non-GaN based diodes on the common substrate. In yet other examples, the diodes may receive an alternating positive and low potential, while the diodes apply only potential V− to the common substrate.

Figure 9A:
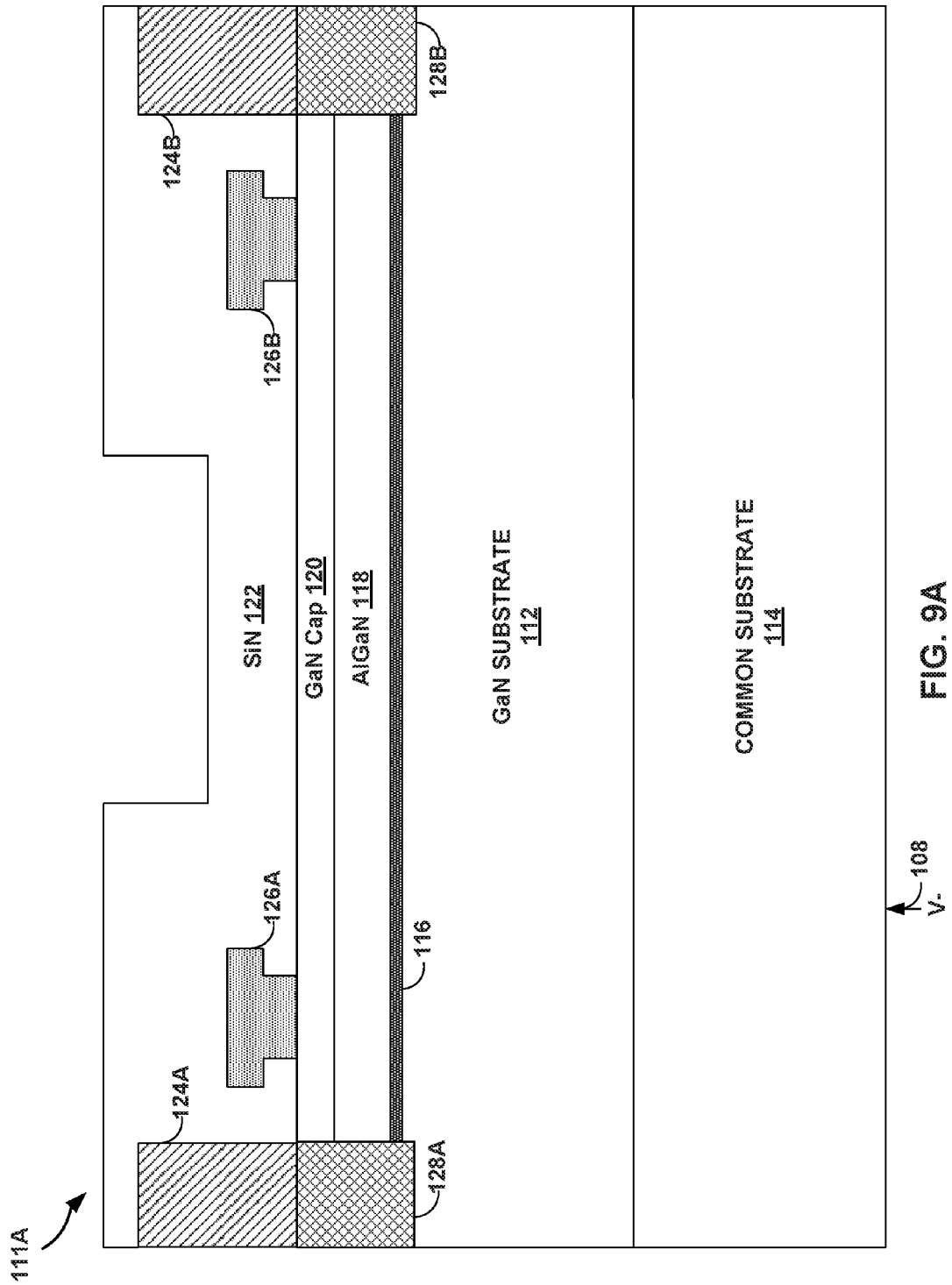
Figure 9B:
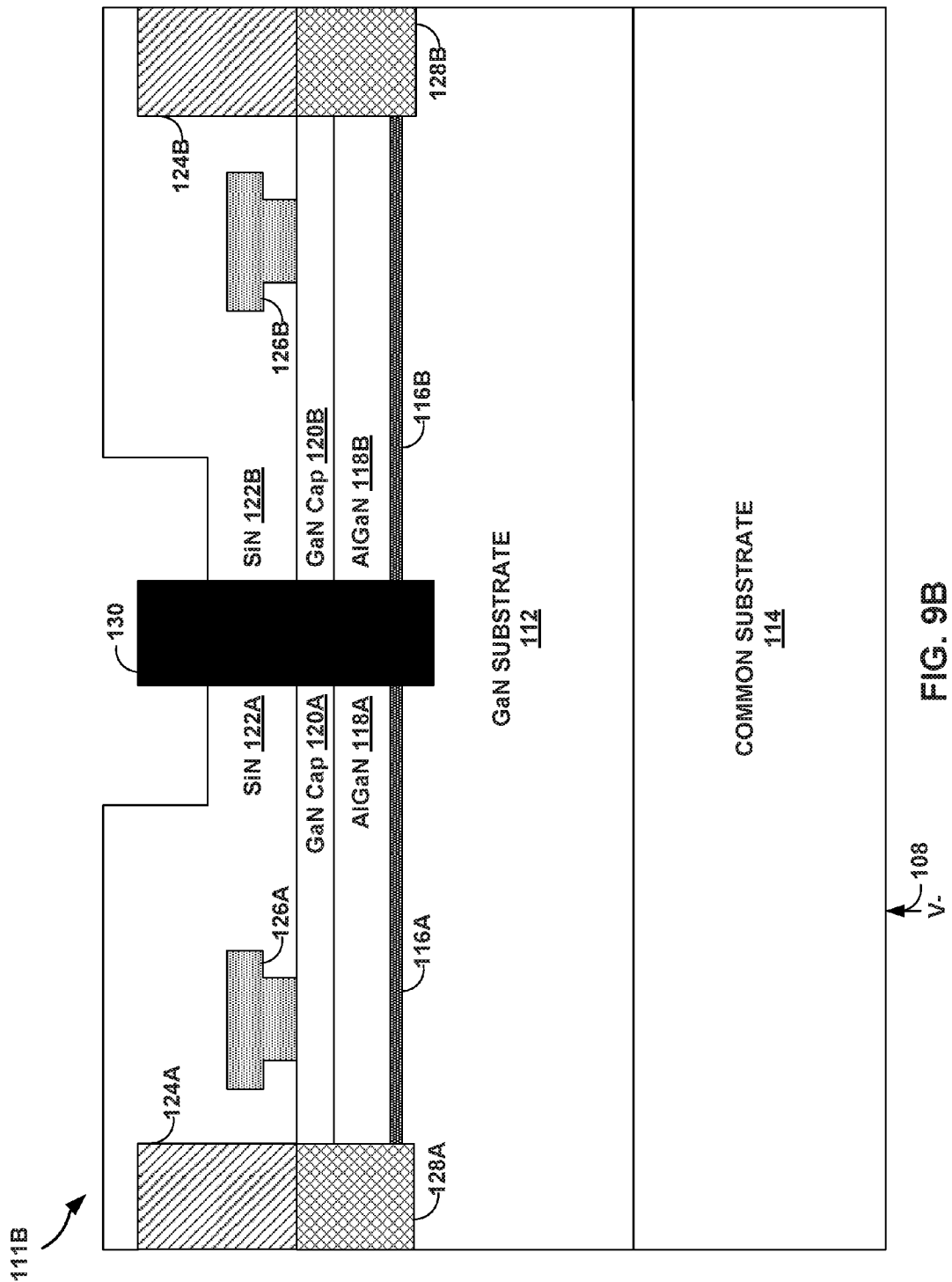

FIGS. 9A-9C are cross sectional layered views each illustrating an example of a switched-based semiconductor body 111A, 111B, 111C of the example semiconductor body 111 shown in FIG. 2. In the example of FIGS. 9A-9C, semiconductor bodies 111A, 111B, 111C include GaN substrate 112 and common substrate 114, as described in FIG. 2, and potential V− applied by link 108, which may correspond to links 24 and/or links 26 as described in FIG. 2. In the example of FIG. 9A, semiconductor body 111A is a bidirectional switch and also includes a current conducting channel specified as two-dimensional electron gas (2DEG) region 116, gallium nitride (GaN) cap 120, silicon nitride (SiN) layer 122, source 124A,124B, gate 126A, 126B, and ohmic contact 128A, 128B. In the example of FIG. 9A, ohmic contact 128A and source 124A form a source terminal.

2DEG region 116 is a current conducting channel of two-dimensional electron gas with the gas of electrons being free to move in two dimensions, but tightly confined in the third dimension. In some examples, 2DEG region 116 may be formed by the heterojunction between two semiconducting materials to confine electrons to a triangular quantum well. In other examples, electrons confined to 2DEG region 116 of HEMTs exhibit higher mobilities than those in MOSFETs, since HEMTs utilize an intentionally undoped channel thereby mitigating the deleterious effect of ionized impurity scattering.

GaN Cap 120 is optional and represents a layer of gallium nitride, similar to GaN substrate 112, as described in FIG. 2.

In some examples, GaN cap 120 may serve to reduce the leakage current when there is a Schottky barrier as the gate. In other examples, GaN cap 130 may offer an additional barrier to the electrons.

Silicon nitride (SiN) layer 122 is a layer of SiN semiconductor material. In some examples, SiN layer 122 passivation helps decrease current collapse by reducing SiN/GaN/AlGaN interface trap density.

Source 124A, 124B is a source terminal for a high-electron-mobility transistor (HEMT). In some examples, a HEMT, is a field-effect transistor incorporating a junction between two materials (e.g., AlGaN and GaN) with different band gaps (e.g., a heterojunction) as the channel instead of a doped region (as is generally the case for MOSFET). In other examples, source 124A, 124B is a region through which the carriers enter the channel (e.g., 2DEG region 116).

Gate 126A, 126B is a gate terminal for an HEMT. In some examples, gate terminals 126A, 126B receive the drive signal from a driver, such as driver 34A as described in FIG. 3, to drive the HEMT to an "on" state.

Ohmic contact 128A, 128B is an ohmic contact for an HEMT. In some examples, ohmic contact 128A, 128B provides a connection to source 124A, 124B through 2DEG region 116.

In some examples, semiconductor body 111A is a bidirectional switch and may have a potential V− applied by link 108 to the backside of common substrate 114, which repels carriers in the 2DEG region 116 towards AlGaN layer 118 and reduces current collapse. In other examples, repelling carriers in the 2DEG region 116 towards the AlGaN layer 118 may substantially reduce and/or eliminate the current collapse of the bidirectional switch.

In some examples, the potential V− may be applied directly from an input terminal or an output terminal, such as input terminals 20, or output terminals 22 as described in FIG. 2, to common substrate 114 by link 108. In other examples, the potential V− may be applied from input terminals and/or output terminals, such as input terminals 20, and/or output terminals 22 as described in FIG. 2, through diodes (not shown) to common substrate 114 by link 108.

In some examples, semiconductor body 111A may represent a semiconductor device comprising a common substrate electrically coupled to a node of a power circuit and one or more Gallium Nitride (GaN) devices, the one or more GaN devices comprising a GaN substrate adjacent to a front side of the common substrate, a two-dimensional electron gas (2DEG) region adjacent to the GaN substrate and opposite the front side of the common substrate, an Aluminum Gallium Nitride (AlGaN) layer adjacent to the 2DEG region and opposite the GaN substrate, and one or more load terminals, wherein the 2DEG region comprises electrons being repelled away from the GaN substrate toward the AlGaN layer based at least in part on a particular potential at the node of the power circuit electrically coupled to the common substrate, and wherein the particular potential is equal to or more negative than a potential at the one or more load terminals. In other examples, the load terminals of semiconductor 111A may represent one or more drain terminals of the one or more GaN devices, or one or more source terminals of the one or more GaN devices.

In the example of FIG. 9B, semiconductor body 111B is a bidirectional switch and includes two-dimensional electron gas (2DEG) region 116A, 116B, gallium nitride (GaN) cap 120A, 120B, silicon nitride (SiN) layer 122A, 122b, source 124A,124B, gate 126A, 126B, and ohmic contact 128A, 128B, as described in FIG. 9A. In the example of FIG. 9B, semiconductor body 111B also includes drain 130.

Drain 130 is a drain terminal for a HEMT. In some examples, drain 130 is the terminal through which carriers leave the channel (e.g., 2DEG region 116).

In some examples, semiconductor body 111B is a bidirectional switch with a drain and may have a potential V− applied by link 108 to the backside of common substrate 114, which repels carriers in the 2DEG regions 116A, 116B towards AlGaN layers 118A, 118B and reduces current collapse. In other examples, repelling carriers in the 2DEG region 116 towards the AlGaN layer 118 may substantially reduce and/or eliminate the current collapse of the bidirectional switch.

In some examples, the potential V− may be applied directly from an input terminal or an output terminal, such as input terminals 20, or output terminals 22 as described in FIG. 2, to common substrate 114 by link 108. In other examples, the potential V− may be applied from input terminals and/or output terminals, such as input terminals 20, and/or output terminals 22 as described in FIG. 2, through diodes (not shown) to common substrate 114 by link 108.

In the example of FIG. 9C, semiconductor body 111C may have or contain two switches having the same polarity and blocking in the same direction, and includes two-dimensional electron gas (2DEG) region 116A, 116B, gallium nitride (GaN) cap 120A, 120B, silicon nitride (SiN) layer 122A. 122B, source 124A, 124B, gate 126A, 126B, and ohmic contact 128A, 128B, and drain 130 as described in FIG. 9B. In the example of FIG. 9C, semiconductor body 111C also includes drain 130.

In some examples, semiconductor body 111C as two GaN switches may have a potential V− applied by link 108 to the backside of common substrate 114, which repels carriers in the 2DEG regions 116A and 116B towards AlGaN layers 118A and 118B and reduces current collapse. In other examples, repelling carriers in the 2DEG regions 116A and 116B towards the AlGaN layers 118A and 118B may substantially reduce and/or eliminate the current collapse of the two GaN switches.

In some examples, the potential V− may be applied directly from an input terminal or an output terminal, such as input terminals 20, or output terminals 22 as described in FIG. 2, to common substrate 114 by link 108. In other examples, the potential V− may be applied from input terminals and/or output terminals, such as input terminals 20, and/or output terminals 22 as described in FIG. 2, through diodes (not shown) to common substrate 114 by link 108. In yet other examples, the two GaN switches of semiconductor body 111C are arranged such that the GaN switches block into the same direction. In some examples, gate 128B at the midpoint of semiconductor body 111C may be used as a drain and/or as a source.

Figure 10:
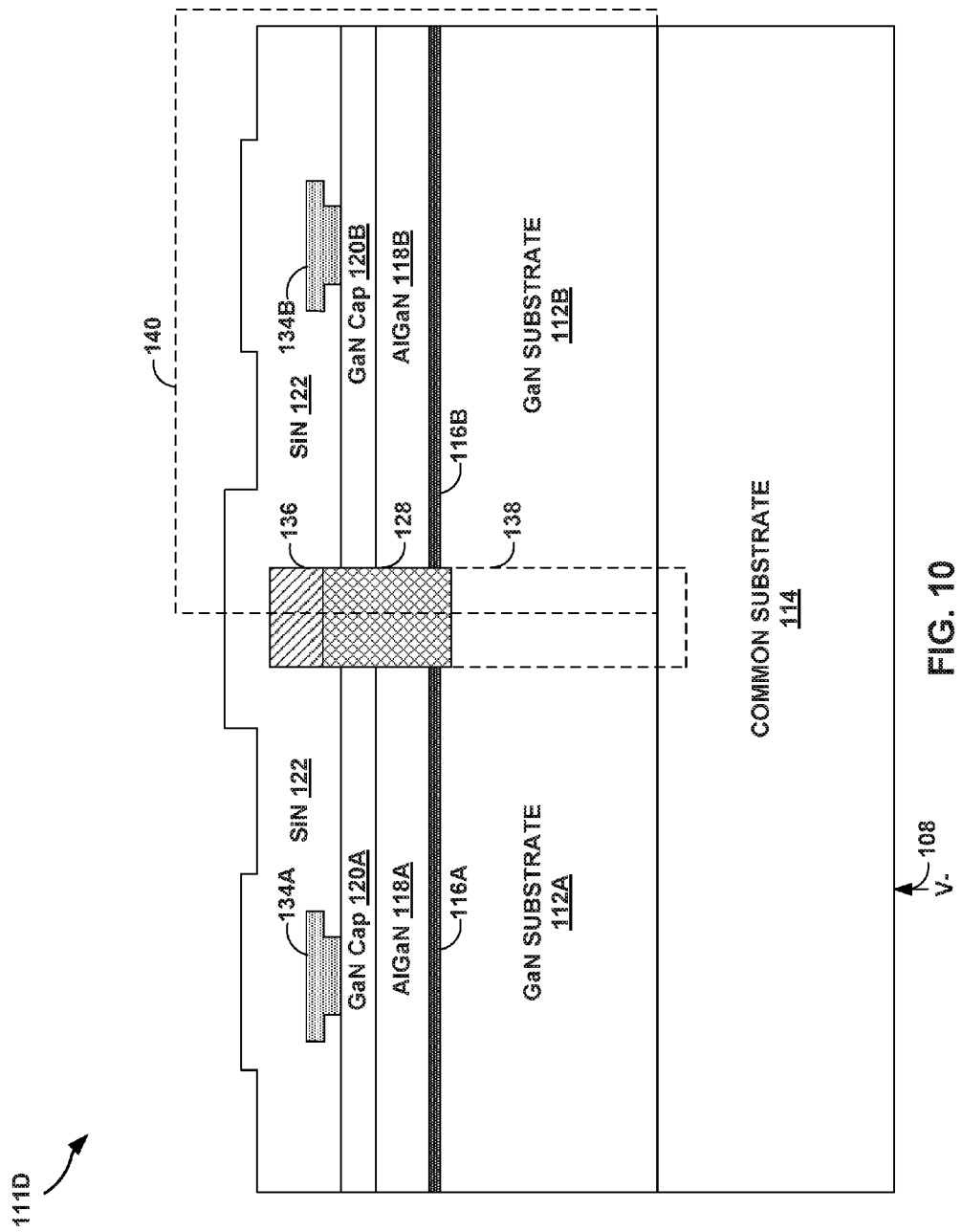
FIG. 10 is a cross sectional layered view illustrating an example of a diode-based semiconductor body of the example semiconductor body shown in FIG. 2.

FIG. 10 is a cross sectional layered view illustrating an example of a diode-based semiconductor body 111D of the example semiconductor body 111 shown in FIG. 2. In the example of FIG. 10, semiconductor body 111D has two Schottky diodes, and includes GaN substrate 112 and adjacent to common substrate 114, as described in FIG. 2, and potential V− applied by link 108, as described in FIGS. 8A-8C. In the example of FIG. 10, semiconductor body 111D includes two-dimensional electron gas (2DEG) regions 116A, 116B, gallium nitride (GaN) cap 120A, 120B, and silicon nitride (SiN) layer 122A, 122B, and ohmic contact 128 as described in FIG. 8B. In the example of FIG. 10, semiconductor body 111D also includes anode 134A, 134B, cathode 136, optional substrate contact 138, and optional lateral Schottky diode 140.

Semiconductor body 111D represents a Schottky diode with a low forward voltage drop and a very fast switching action. In some examples, semiconductor body 111D may have a metal-semiconductor junction formed between a metal and a semiconductor material creating a Schottky barrier. In other examples, the metal of the metal-semiconductor junction of semiconductor body 111D acts as the anode, such as anode 134A, 134B. In yet other examples, the semiconductor of the metal-semiconductor junction of semiconductor body 111D acts as the cathode, such as cathode 136. Lateral Schottky diode 140 may be a lateral Schottky diode on a common substrate with another GaN Schottky diode and/or another GaN device, such as a switch, or a bidirectional switch.

Anode 134A, 134B represent an anode section of semiconductor body 111D, and is an electrode through which electrical current flows into a polarized electrical device. Cathode 136 represent a cathode section of semiconductor body 111D, and is an electrode through which electric current flows out of a polarized electrical device.

Substrate contact 138 represents an optional section of semiconductor body 111D, and is an electrode through which a negative polarity may be applied to a common substrate, such as common substrate 114. In some examples, semiconductor body 111D may receive alternating positive and low potentials, but may apply only a low potential to the common substrate via substrate contact 138.

In some examples, semiconductor body 111D may have a potential V− applied by link 108 to the backside of common substrate 114, which repels carriers in the 2DEG region 116A, 116B towards AlGaN layer 118A, 118B and reduces current collapse. In other examples, repelling carriers in the 2DEG region 116A, 116B towards the AlGaN layer 118A, 118B may substantially reduce and/or eliminate the current collapse of the GaN Schottky diode or diodes.

In some examples, potential V− may be applied directly from an input terminal or an output terminal, such as input terminals 20, or output terminals 22 as described in FIG. 2, to common substrate 114 by link 108. In other examples, the potential V− may be applied from input terminals and/or output terminals, such as input terminals 20, and/or output terminals 22 as described in FIG. 2, through diodes (not shown) to common substrate 114 by link 108. In yet other examples, semiconductor body 111D may use substrate contact 138 to apply potential V−. In some examples, GaN Schottky diodes 110E may receive alternating positive and low potentials from one or more input and/or output terminals, and substrate contact 138 may only apply potential V− to common substrate 114.

In some examples, semiconductor body 111D may represent a semiconductor device comprising a common substrate electrically coupled to a node of a power circuit and one or more Gallium Nitride (GaN) devices, the one or more GaN devices comprising a GaN substrate adjacent to a front side of the common substrate, a two-dimensional electron gas (2DEG) region adjacent to the GaN substrate and opposite the front side of the common substrate, an Aluminum Gallium Nitride (AlGaN) layer adjacent to the 2DEG region and opposite the GaN substrate, and one or more load terminals, wherein the 2DEG region comprises electrons being repelled away from the GaN substrate toward the AlGaN layer based at least in part on a particular potential at the node of the power circuit electrically coupled to the common substrate, and wherein the particular potential is equal to or more negative than a potential at the one or more load terminals. In other examples, the load terminals of semiconductor 111D may represent one or more cathode electrodes of the one or more GaN devices, or one or more anode electrodes of the one or more GaN devices.

Figure 11:
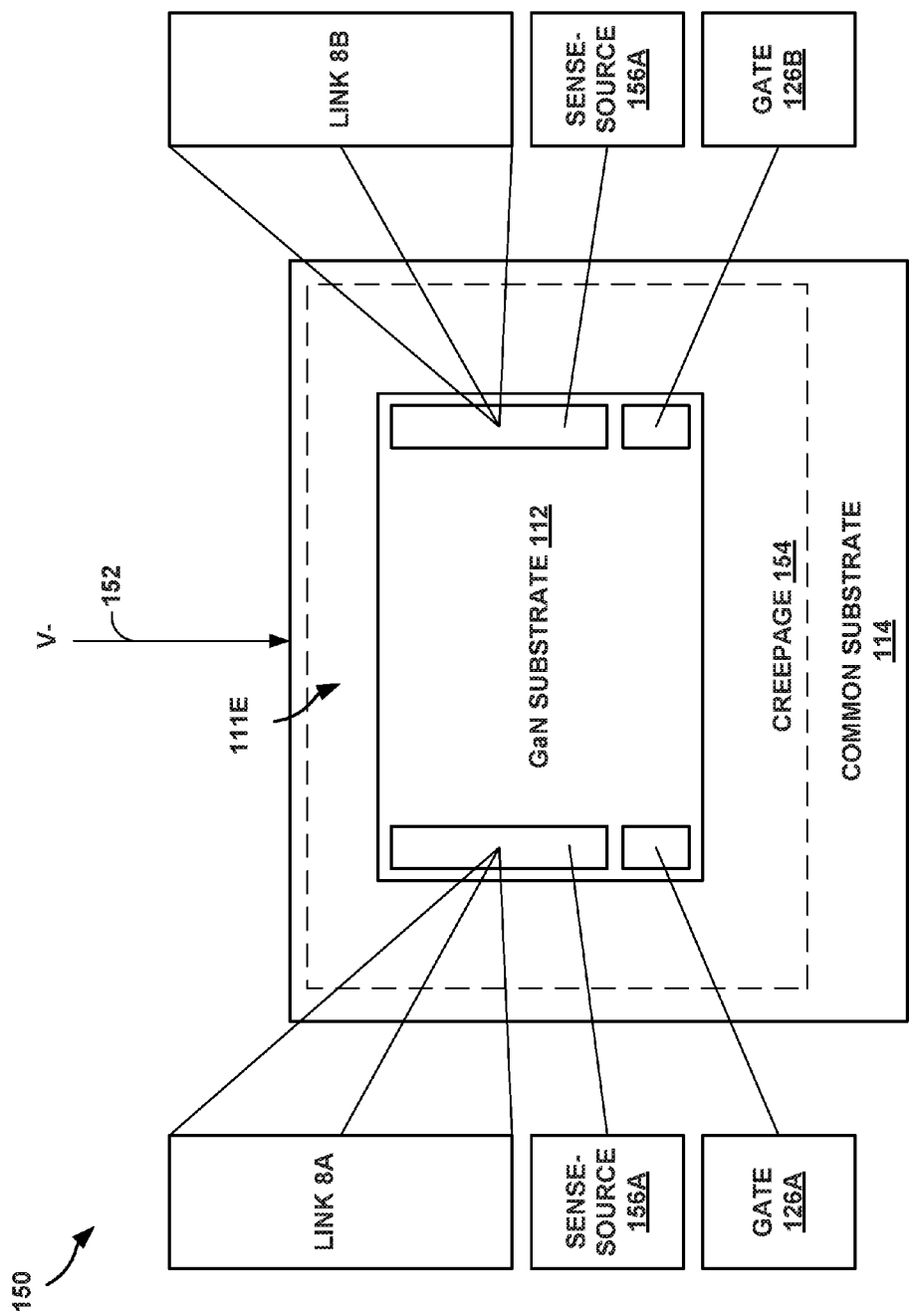
FIGS. 11-13 are block diagrams each illustrating example semiconductor packages that include the example power circuit shown in FIG. 2, in accordance with one or more aspects of the present disclosure.
Figure 12:
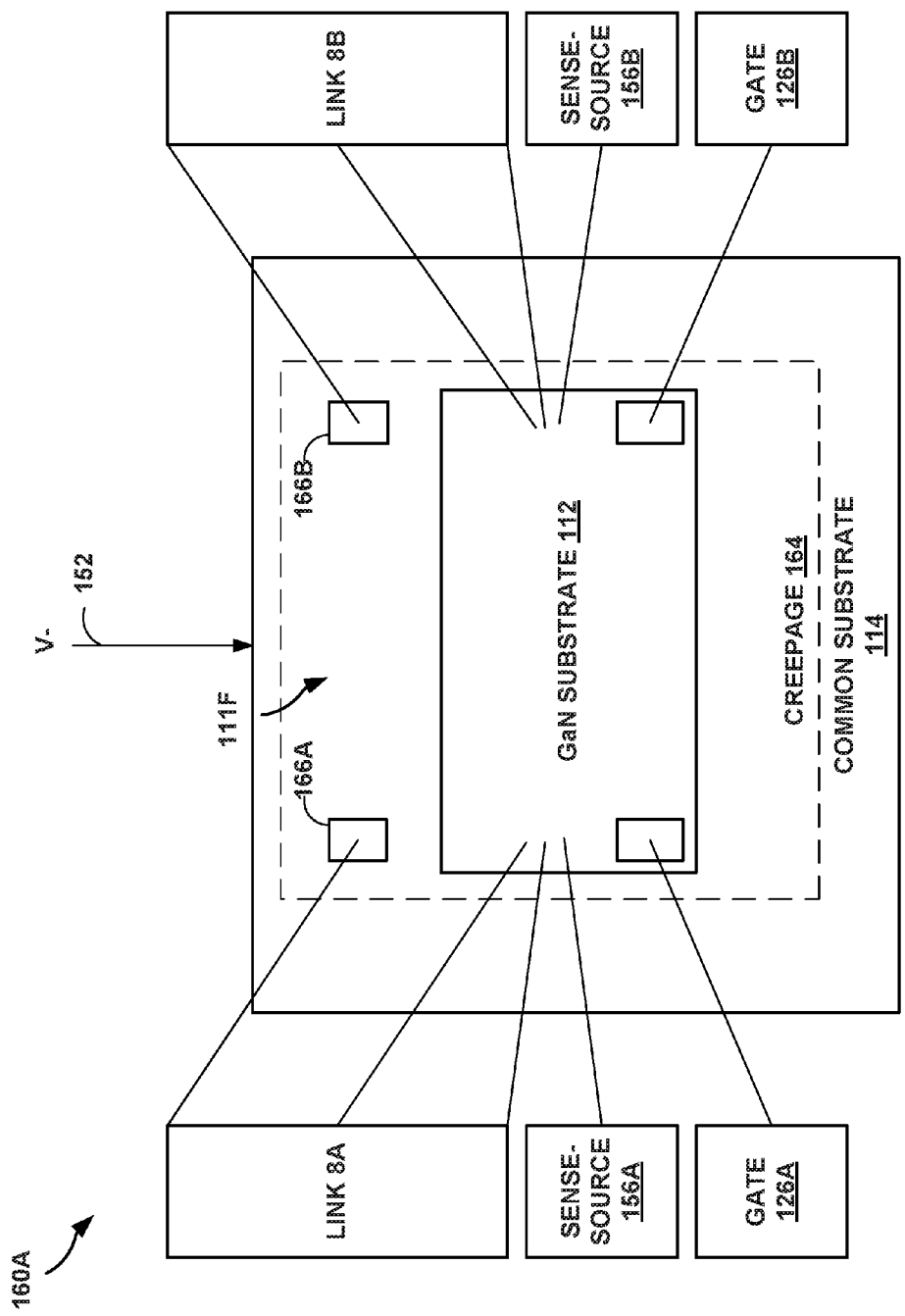
Figure 13:
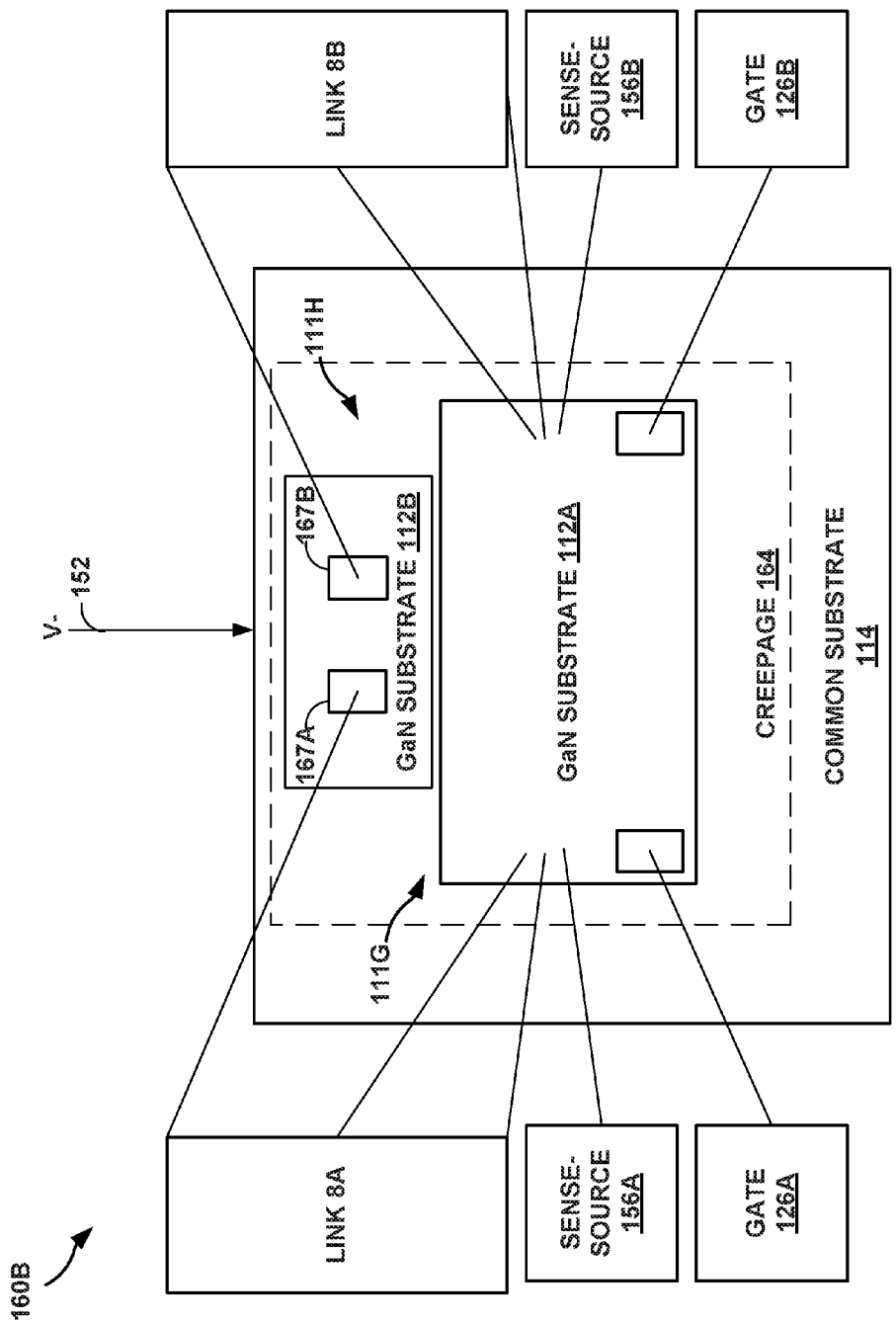

FIGS. 11-13 are block diagrams each illustrating example semiconductor packages that include the example power circuit 6 shown in FIG. 2, in accordance with one or more aspects of the present disclosure. FIGS. 11-13 are described below within the context of power circuit 6 of FIG. 2.

In the example of FIG. 11, semiconductor package 150 includes semiconductor body 111E, which may correspond to semiconductor body 111, GaN substrate 112, common substrate 114, and links 8A, 8B of link 8. In the example of FIG. 11, semiconductor package 150 also includes sense-source 156A, 156B, which may correspond to source 124A, 124B, and gate 126A, 126B, as described in FIGS. 9A-10. In the example of FIG. 11, semiconductor package also includes potential V− directly applied and/or electrically connected to common substrate 114 by link 152, which may correspond to links 24 and/or links 26 as described in FIG. 2, and creepage 154.

Sense-source 156A, 156B is a contact to the same terminal as the source. In some examples, the gate driver is coupled between gates 126A, 126B and sense-source contacts 156A, 156B to avoid any parasitic voltage drop on any inductance that may be present within the current path towards links 8A, 8B. In other examples, the two terminals for links 8A, 8B and sense-source 156A, 156B may be used differently outside the semiconductor package but are connected to the same terminal inside the package.

Creepage 154 represents an electrical insulator material whose internal electric charges do not flow freely. In some examples, creepage 154 may be used to isolate common substrate 114 based on varying thicknesses. In other examples, creepage 154 may allow an electrode to be applied to common substrate 114 to apply potential V− while isolating common substrate 114 from other potentials. In yet other examples, the semiconductor package may need to isolate both links 8A and 8B from the common substrate with minimum thicknesses of creepage 154 defined in various standards depending on pollution classes of the environment.

In the example of FIG. 12, semiconductor package 160A includes semiconductor body 111F, which may correspond to semiconductor body 111, GaN substrate 112, common substrate 114, and links 8A, 8B of link 8. In the example of FIG. 12, semiconductor package 160A also includes sense-source 156A, 156B and gate 126A, 16B, as described in FIG. 11, along with potential V− applied to common substrate 114 by link 162 which may correspond to links 24, 26, and/or 152 as described in FIG. 11, diodes 166A, 166B and creepage 164, which may correspond to creepage 154 as described in FIG. 11.

Diodes 166A, 166B may represent non-GaN based diodes, such as a semiconductor diode with a p-n junction, on common substrate 114. In some examples, common substrate 114 may receive by link 162, potential V− from the input terminals and/or the output terminals, such as input terminals 20 and output terminals 22 as described in FIG. 2. In other examples, diodes 166A, 166B may be configured to be coupled between the V− potential (on their backside) and the two input terminals 8A and 8B respectively, and all the connections can all be made within the package. In yet other examples, diodes 166A, 166B may not be located on common substrate 114, but on a separate substrate (not shown).

In the example of FIG. 13, semiconductor package 160B includes semiconductor bodies 111G, 111H which may correspond to semiconductor body 111, GaN substrate 112, common substrate 114, and links 8A, 8B of link 8. In the example of FIG. 13, semiconductor package 160B also includes sense-source 156A, 156B and gate 126A, 16B as described in FIG. 11, along with potential V− applied to common substrate 114 by link 162 which may correspond to links 24, 26, and/or link 152, as described in FIG. 11, and creepage 164, which may correspond to creepage 154 as described in FIG. 11.

In the example of FIG. 13, diodes 167A, 167B represent GaN based diodes, such as Semiconductor body 111D, as described in FIG. 10. In some examples, common substrate 114 may receive by link 162 potential V− from the input terminals and/or the output terminals, such as input terminals 20 and output terminals 22 as described in FIG. 2. In other examples, GaN Schottky diodes 167A, 167B may be configured may be configured to be coupled between the V− potential (on their backside) and the two input terminals 8A and 8B respectively, and all the connections can all be made within the package. In yet other examples, GaN Schottky diodes 167A, 167B may not be located on common substrate 114, but on a separate common substrate (not shown).

Figure 14:
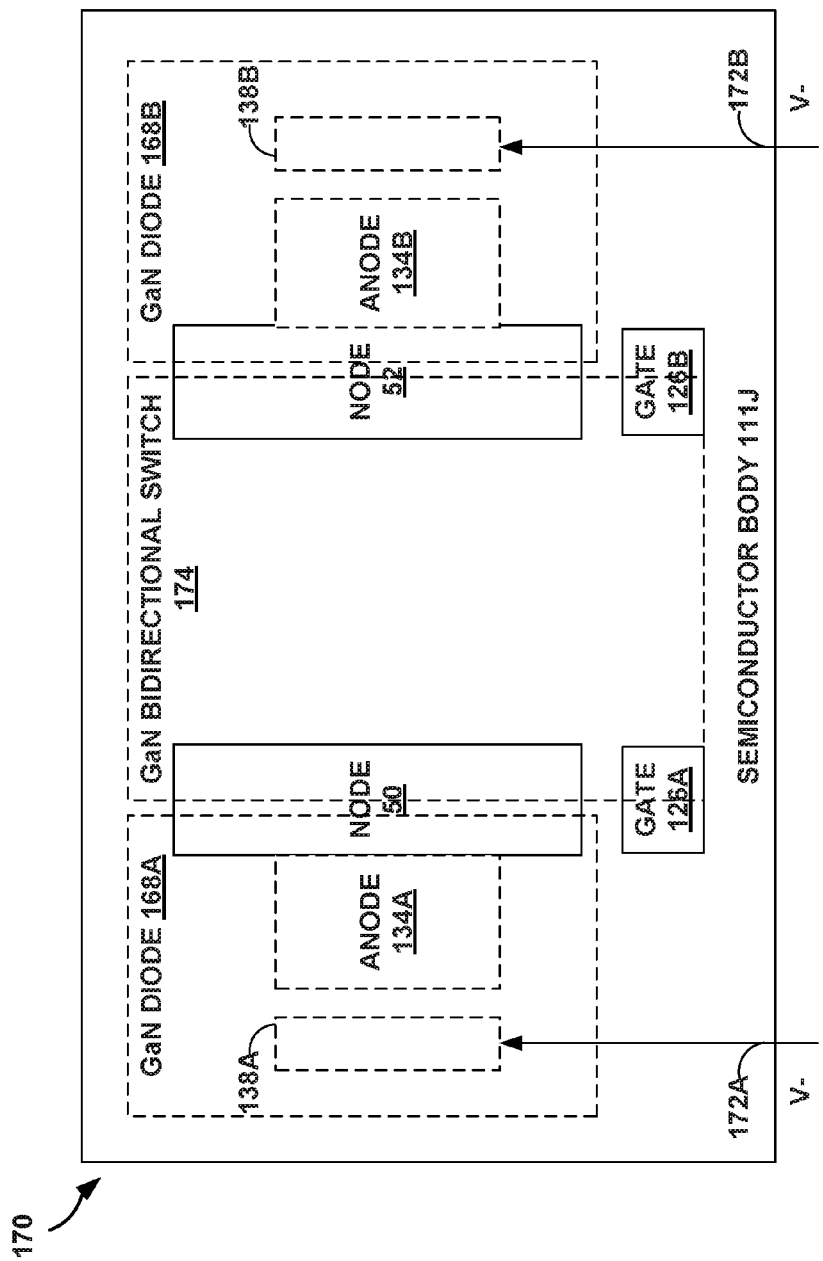
FIG. 14 is a block diagram illustrating an example of a package with a GaN diodes and a GaN bidirectional switch on a semiconductor body, in accordance with one or more aspects of the present disclosure.

FIG. 14 is a block diagram illustrating an example of package 170 with GaN diodes 168A, 168B and GaN bidirectional switch 174 on semiconductor body 111J, in accordance with one or more aspects of the present disclosure. FIG. 14 is described below within the context of power circuit in FIG. 3. In the example of FIG. 14, package 170 includes semiconductor body 111J, which may correspond to semiconductor body 30A, GaN diodes 168A, 168B, which may correspond to diodes 34A, 34B, and GaN bidirectional switch 174, which may correspond to GaN bidirectional switch 30A. In the example of FIG. 14, package 170 also includes nodes 50, 52 as described in FIG. 3, gate 126A, 126B, anode 134A, 134B, and optional substrate contact 138A, 138B, as described in FIG. 10, and links 172A, 172B, which provide potential V− to anode 134A, 134B and may correspond to links 24, 26 as described in FIG. 2. In the example of FIG. 14, package 170 includes three GaN devices, such as GaN bidirectional switch 174, and GaN diodes 168A, 168B toward potential V−, with dotted lines to conceptually indicate their location on semiconductor body 111J. In other examples, the dotted lines may also indicate that GaN diodes 168A and 168B may be optional and may be located on separate packages. In yet other examples, GaN diodes 168A and 168B may be included with additional diodes and/or switches in package 170 with four power terminals connected to input and/or output links, such links 8A, 8B of link 8 and links 10A, 10B of link 10 as described in FIG. 1.

In the example of FIG. 14, the cathode potential of diodes 168A, 168B may be potential V−, which is available at substrate contacts 138A and 138B on the surface of the chip. In some examples, potential V− of the cathodes of diodes 168A, 168B may be electrically connected to the substrate by either a vertical trench contact (e.g., substrate contacts 138A, 138B as described in FIG. 10) through the AlGaN/GaN layers (e.g., AlGaN 118A, 118B, or GaN substrate 112A, 112B as described in FIG. 10) into the substrate (e.g., common substrate 114 as described in FIG. 10). In other examples, potential V− of the cathodes of diodes 168A, 168B may be electrically connected to the substrate by bonding a wire (not shown) from links 172A, 172B to the metallized island (not shown), which supports semiconductor body 111J.

In some examples, diodes 168A, 168B may apply only potential V− to a common substrate (not shown). In other examples, diodes 168A, 168B may apply only potential V− to a common substrate (not shown) through substrate contacts 138A, 138B. In yet other examples, diodes 168A, 168B may apply only potential V− to a backside of a common substrate (not shown). In some examples, diodes 168A, 168B may be located on a common substrate of semiconductor body 111 with other GaN devices, such as GaN devices 110, as described in FIG. 1. In other examples, diodes 168A, 168B may be located on a separate common substrate. In yet other examples, diodes 168A, 168B may be non-GaN based diodes with a semiconductor p-n junction.

Figure 15:
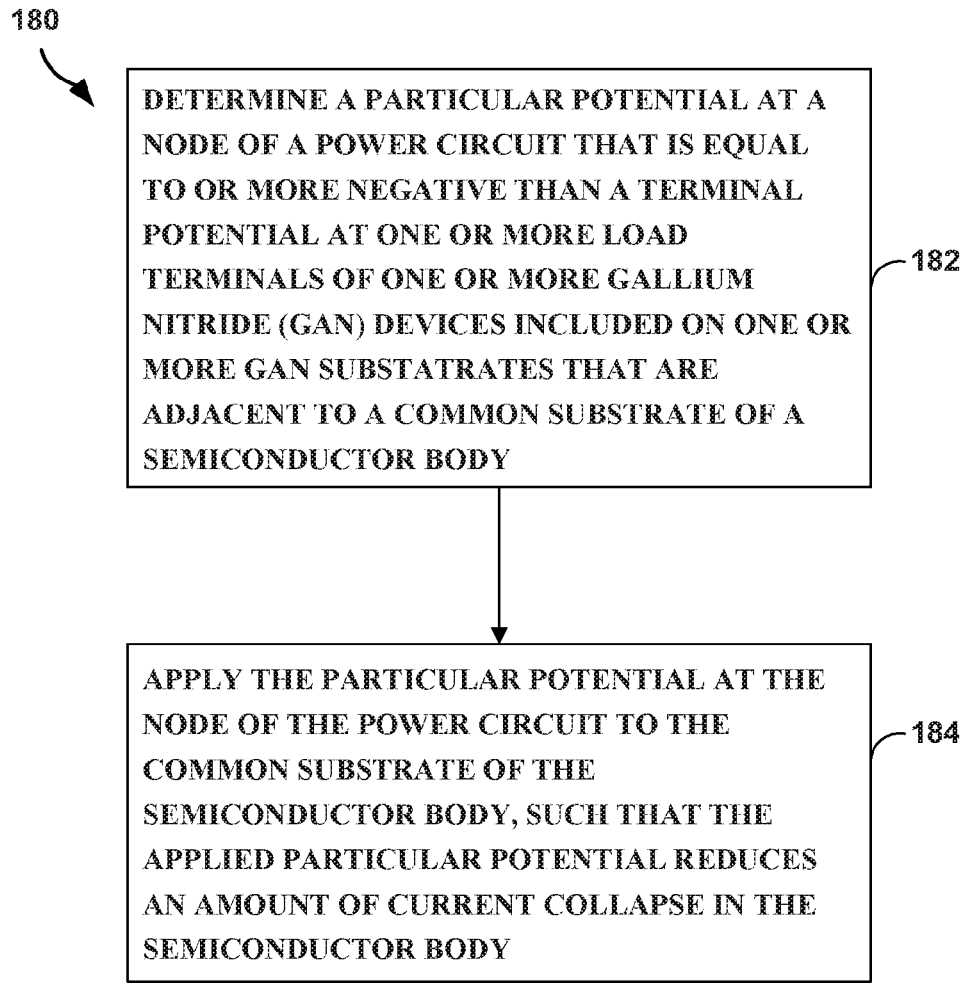
FIG. 15 is a flow chart illustrating example operations for reducing current collapse of an example power circuit, in accordance with one or more aspects of the present disclosure.

FIG. 15 is a flow chart illustrating example operations for reducing current collapse of an example power circuit 6, in accordance with one or more aspects of the present disclosure. FIG. 15 is described below within the context of links 24, 26 of FIG. 2, system 1 of FIG. 1, and power circuit 6 of FIG. 2.

In the example of FIG. 15, controller unit 5 as described in FIG. 1 may determine a particular potential (e.g., potential V−) at a node of a power circuit (e.g., power circuit 6) that is equal to or more negative than a terminal potential at one or more load terminals (e.g., a source or a drain terminal of a GaN switch, a cathode or anode electrode of a GaN diode) of one or more Gallium Nitride (GaN) devices (e.g., GaN devices 110) included on one or more GaN substrates (e.g., GaN substrate 112) that are adjacent to a common substrate (e.g., common substrate 114) of a semiconductor body (e.g., semiconductor body 111) (182). For example, controller unit 5 may receive information via link 8 and/or 10 that indicates a particular potential (e.g., potential V−) of one or more GaN devices 110 of power circuit 6. Based on the information received via link 8 and/or 10, controller unit 5 may provide a command or signal via link 9 to power circuit 6 that causes the particular potential of power circuit 6 to be applied to a common substrate of a semiconductor body of power circuit 6.

After controller unit 5 determines the particular potential (e.g., potential V−), power circuit 6 may receive a signal and/or command from controller unit 5 to apply (e.g., links 24, 26) the particular potential (e.g., potential V−) at the node (e.g., input terminals 20, output terminals 22) of the power circuit to the common substrate (e.g., common substrate 114) of the semiconductor body (e.g., semiconductor body 111), such that the applied particular potential (e.g., potential V−) reduces an amount of current collapse in the semiconductor body (184).

In some examples, power circuit 6 may directly apply the particular potential at the node of the power circuit to the common substrate, such as potential V− to common substrate 114 as described in FIG. 10. In other examples, power circuit 6 may receive a signal from controller unit 5, after controller unit 5 determines a particular potential of the circuit, to apply the particular potential at the node of the power circuit to the common substrate through a pair of diodes, such as V− to common substrate 114 through diodes 168A, 168B as described in FIG. 14. In yet other examples, switches may be used in place of diodes.

In some examples, controller unit 5 may apply the particular potential at the node of the power circuit by electrically coupling an input potential of an input terminal of the power circuit or an output potential of an output terminal of the power circuit to the common substrate. In other words, controller unit 5 may apply potential V− by electrically coupling (e.g., links 24, 26) input terminals 20 or output terminals 22 to common substrate 114 of semiconductor body 111.

In other examples, controller unit 5 may apply the particular potential at the node of the power circuit by configuring the one or more Gallium Nitride (GaN) devices to electrically couple an input potential of an input terminal of the power circuit or an output potential of an output terminal of the power circuit to the common substrate. For example, controller unit 5 may apply potential V− by configuring one or more GaN devices 110 to electrically couple (e.g., links 24, 26) input terminals 20 or output terminals 22 to common substrate 114 of semiconductor body 111.

In yet other examples, controller unit 5 may apply the particular potential at the node of the power circuit by configuring one or more non-Gallium Nitride (non-GaN) devices to electrically couple a potential of an input terminal of the power circuit or an output terminal of the power circuit to the common substrate. For example, controller unit 5 may apply potential V− by configuring one or more non-GaN devices (e.g., diodes, switches, etc.) to electrically couple (e.g., links 24, 26) input terminals 20 or output terminals 22 to common substrate 114 of semiconductor body 111.

Clause 1. A power circuit comprising: a semiconductor body, the semiconductor body comprising: a common substrate; and a Gallium Nitride (GaN) based substrate including one or more GaN devices adjacent to a front side of the common substrate, wherein the common substrate is electrically coupled to a node of the power circuit, the node being at a particular potential that is equal to or more negative than a potential at one or more load terminals of the one or more GaN devices.

Clause 2. The power circuit of clause 1, wherein the one or more load terminals is selected from the group consisting of: one or more drain terminals of the one or more GaN devices, one or more source terminals of the one or more GaN devices, one or more cathode electrodes of the one or more GaN devices, and one or more anode electrodes of the one or more GaN devices.

Clause 3. The power circuit of any of clauses 1-2, wherein the particular potential at the node of the power circuit comprises a potential of at least one of one or more input terminals of the power circuit or one or more output terminals of the power circuit.

Clause 4. The power circuit of any of clauses 1-3, wherein the one or more GaN devices is selected from the group consisting of: one or more GaN bidirectional switches, a plurality of GaN switches, a plurality of GaN diodes, and a GaN switch and a GaN diode.

Clause 5. The power circuit of any of clauses 1-4, wherein the one or more GaN devices comprise one or more GaN switches and one or more GaN diodes.

Clause 6. The power circuit of any of clauses 1-5, wherein the node of the power circuit is an electrode of at least one of the one or more Gallium Nitride (GaN) devices arranged on the front side of the common substrate.

Clause 7. The power circuit of clause 6, wherein the electrode of the at least one of the one or more GaN devices comprises at least one of a cathode electrode of a GaN diode or a source electrode of GaN switch.

Clause 8. The power circuit of any of clauses 1-7, wherein the semiconductor body further comprises: one or more non-Gallium Nitride (non-GaN) devices arranged on the front side of the common substrate, wherein the node of the power circuit comprises an electrode of at least one of the one or more non-GaN devices, and wherein the electrode of the at least one of the one or more non-GaN devices comprises at least one of a cathode electrode of a non-GaN diode or a source electrode of a non-GaN switch.

Clause 9. The power circuit of any of clauses 1-8, wherein the power circuit comprises at least one of a rectifier or an inverter.

Clause 10. The power circuit of any of clauses 1-9, wherein the one or more GaN devices comprise one or more GaN switches and one or more GaN diodes arranged in at least one of a half-bridge or a H-bridge configuration.

Clause 11. A semiconductor device comprising: a common substrate electrically coupled to a node of a power circuit; and one or more Gallium Nitride (GaN) devices, the one or more GaN devices comprising: a GaN substrate adjacent to a front side of the common substrate; a two-dimensional electron gas (2DEG) region adjacent to the GaN substrate and opposite the front side of the common substrate; an Aluminum Gallium Nitride (AlGaN) layer adjacent to the 2DEG region and opposite the GaN substrate; and one or more load terminals, wherein the 2DEG region comprises electrons being repelled away from the GaN substrate toward the AlGaN layer based at least in part on a particular potential at the node of the power circuit electrically coupled to the common substrate, and wherein the particular potential is equal to or more negative than a potential at the one or more load terminals.

Clause 12. The semiconductor device of clause 11, wherein the one or more load terminals is selected from the group consisting of: one or more drain terminals of the one or more GaN devices, one or more source terminals of the one or more GaN devices, one or more cathode electrodes of the one or more GaN devices, and one or more anode electrodes of the one or more GaN devices.

Clause 13. The semiconductor device of any of clauses 11-12, wherein the one or more GaN devices is selected from the group consisting of: one or more GaN bidirectional switches, a plurality of GaN switches, a plurality of GaN diodes, and a GaN switch and a GaN diode.

Clause 14. The semiconductor device of any of clauses 11-13, wherein the common substrate comprises a silicon substrate.

Clause 15. The semiconductor device of any of clauses 11-14, wherein a back side of the common substrate comprises an electrode of the common substrate that is electrically isolated from each of one or more electrodes of the one or more GaN devices.

Clause 16. The semiconductor device of clause 15, wherein the particular potential at the node of the power circuit is coupled to the electrode of the common substrate, and wherein the particular potential increases a quantity of the electrons being repelled from the GaN substrate to the AlGaN layer of the one or more GaN devices.

Clause 17. A method comprising: determining a particular potential at a node of a power circuit that is equal to or more negative than a terminal potential at one or more load terminals of one or more Gallium Nitride (GaN) devices, wherein each of the one or more GaN devices is included on one or more GaN substrates of a semiconductor body, the one or more GaN substrates being adjacent to a front side of a common substrate of the semiconductor body; and applying the particular potential at the node of the power circuit to the common substrate of the semiconductor body, wherein applying the particular potential reduces an amount of current collapse in the semiconductor body.

Clause 18. The method of clause 17, wherein applying the particular potential at the node of the power circuit comprises electrically coupling an input potential of an input terminal of the power circuit or an output potential of an output terminal of the power circuit to the common substrate.

Clause 19. The method of any of clauses 17-18, wherein applying the particular potential at the node of the power circuit comprises configuring the one or more Gallium Nitride (GaN) devices to electrically couple an input potential of an input terminal of the power circuit or an output potential of an output terminal of the power circuit to the common substrate.

Clause 20. The method of any of clauses 17-19, wherein applying the particular potential at the node of the power circuit comprises configuring one or more non-Gallium Nitride (non-GaN) devices to electrically couple a potential of an input terminal of the power circuit or an output terminal of the power circuit to the common substrate.

Clause 21. A power circuit comprising means for performing any of the methods of clauses 17-20 above.

Any of the methods, devices, and circuits described above may be embodied in or performed in whole or in part by any of various types of integrated circuits, chip sets, and/or other devices, and/or as software executed by a computing device, for example. This may include processes performed by, executed by, or embodied in one or more microcontrollers, central processing units (CPUs), processing cores, field-programmable gate arrays (FPGAs), programmable logic devices (PLDs), virtual devices executed by one or more underlying computing devices, or any other configuration of hardware and/or software.

Various examples have been described. These and other examples are within the scope of the following claims.

The invention claimed is:

1. A method comprising:
   determining a most negative potential at any of a plurality of load terminals of one or more Gallium Nitride (GaN) devices, wherein:
      each of the plurality of load terminals is coupled to a load;
      the one or more GaN devices are adjacent to a front side of a common substrate of a semiconductor body;
      the one or more GaN devices comprise a plurality of input terminals that are each configured to couple to a source that is configured to produce power for the load; and
      the one or more GaN devices comprise one or more gate terminals in addition to the plurality of input terminals and the plurality of load terminals, the one or more gate terminals being configured to receive a gate control signal from one or more drivers; and
   applying, as a constant potential, the most negative potential to a node on a back side of the common substrate.

2. The method of claim 1, wherein the one or more GaN devices comprise one or more GaN switches arranged in at least one half-bridge configuration.

3. The method of claim 2, wherein the one or more GaN switches are arranged in three half-bridge configurations.

4. The method of claim 1, wherein the plurality of load terminals is selected from the group consisting of:
   one or more drain terminals of the one or more GaN devices,
   one or more source terminals of the one or more GaN devices,
   one or more cathode electrodes of the one or more GaN devices, and
   one or more anode electrodes of the one or more GaN devices.

5. The method of claim 1, wherein the most negative potential is a first most negative potential at a first terminal of the plurality load terminals, the method further comprising:
   after applying the first most negative potential to the node on the back side of the common substrate, determining a second most negative potential at any of the plurality of load terminals, wherein the second most negative potential is at a different load terminal of the plurality of load terminals than the first terminal; and
   applying, as the constant potential, the second most negative potential to the node on the back side of the common substrate.

6. The method of claim 1, wherein applying the most negative potential to the node on the backside of the common substrate comprises electrically coupling the node on the common substrate to a particular terminal from the plurality of load terminals that is at the most negative potential.

7. A power circuit comprising:
   one or more drivers;
   a semiconductor body, the semiconductor body comprising:
      a common substrate; and
      a Gallium Nitride (GaN) based substrate including one or more GaN devices adjacent to a front side of the common substrate, wherein the one or more GaN devices comprise:
         one or more gate terminals configured to receive a gate control signal from the one or more drivers; and
         a plurality of input terminals configured to couple to a power source that is configured to produce power for the load;
         a plurality of load terminals configured to couple to a load; and
   a controller configured to:
      determine a most negative potential at any of the plurality of load terminals; and
      apply, as a constant potential, the most negative potential to a node on a back side of the common substrate.

8. The power circuit of claim 7, wherein the one or more GaN devices comprise one or more GaN switches arranged in at least one half-bridge configuration.

9. The power circuit of claim 8, wherein the one or more GaN switches are arranged in three half-bridge configurations.

10. The power circuit of claim 7, wherein the plurality of load terminals are selected from the group consisting of:
   one or more drain terminals of the one or more GaN devices,
   one or more source terminals of the one or more GaN devices,
   one or more cathode electrodes of the one or more GaN devices, and
   one or more anode electrodes of the one or more GaN devices.

11. The power circuit of claim 7, wherein the most negative potential is a first most negative potential at a first terminal of the plurality of load terminals, the controller is further configured to:
   after applying the first most negative potential to the node on the back side of the common substrate, determine a second most negative potential at any of the plurality of load terminals, wherein the second most negative potential is at a different terminal of the plurality of load terminals than the first load terminal; and
   applying, as the constant potential, the second most negative potential to the node on the back side of the common substrate.

12. The power circuit of claim 7, wherein the controller is further configured to apply the most negative potential to the node on the backside of the common substrate by at least electrically coupling the node on the common substrate to a particular terminal from the plurality of load terminals that is at the most negative potential by closing or opening a switch to couple the node on the common substrate to the particular terminal.

13. The power circuit of claim 7, wherein:
the one or more GaN devices comprise at least a portion of a DC-DC or DC-AC power circuit and the plurality of load terminals are an input stage of the DC-DC or DC-AC power circuit; or
the one or more GaN devices comprise at least a portion of an AC-DC power circuit and the plurality of load terminals are an output stage of the AC-DC power circuit.

14. A system comprising:
means for determining a most negative potential at any of a plurality of load terminals of one or more Gallium Nitride (GaN) devices, wherein:
each of the plurality of load terminals is coupled to a load;
the one or more GaN devices are adjacent to a front side of a common substrate of a semiconductor body;
the one or more GaN devices comprise a plurality of input terminals that are each configured to couple to a source that is configured to produce power for the load; and
the one or more GaN devices comprise one or more gate terminals in addition to the plurality of input terminals and the plurality of load terminals, the one or more gate terminals being configured to receive a gate control signal from one or more drivers; and
means for applying, as a constant potential, the most negative potential to a node on a back side of the common substrate.

15. The system of claim 14, wherein the one or more GaN devices comprise one or more GaN switches arranged in at least one half-bridge configuration.

16. The system of claim 15, wherein the one or more GaN switches are arranged in three half-bridge configurations.

17. The system of claim 14, wherein the plurality of load terminals are selected from the group consisting of:
one or more drain terminals of the one or more GaN devices,
one or more source terminals of the one or more GaN devices,
one or more cathode electrodes of the one or more GaN devices, and
one or more anode electrodes of the one or more GaN devices.

18. The system of claim 14, wherein the most negative potential is a first most negative potential at a first terminal of the plurality of load terminals, the system further comprising:
means for after applying the first most negative potential to the node on the back side of the common substrate, determining a second most negative potential at any of the plurality of load terminals, wherein the second most negative potential is at a different terminal of the plurality of load terminals than the first terminal; and
means for applying, as the constant potential, the second most negative potential to the node on the back side of the common substrate.

19. The system of claim 14, wherein the means for applying the most negative potential to the node on the backside of the common substrate comprise means for electrically coupling the node on the common substrate to a particular terminal from the plurality of load terminals that is at the most negative potential.

20. The system circuit of claim 19, wherein the means for electrically coupling the node on the common substrate to the particular terminal comprises means for closing or opening a switch to couple the node on the common substrate to the particular terminal.

* * * * *